(12) United States Patent
Ogiso

(10) Patent No.: US 6,933,794 B2
(45) Date of Patent: Aug. 23, 2005

(54) VOLTAGE-CONTROLLED OSCILLATOR AND ELECTRONIC DEVICE USING SAME

(75) Inventor: Hiroyuki Ogiso, Ira (JP)

(73) Assignee: Seiko Epson Corporation (JP)

(*) Notice: Subject to any disclaimer, the term of this patent is extended or adjusted under 35 U.S.C. 154(b) by 102 days.

(21) Appl. No.: 10/712,411

(22) Filed: Nov. 13, 2003

(65) Prior Publication Data

US 2004/0140857 A1 Jul. 22, 2004

(30) Foreign Application Priority Data

Nov. 13, 2002 (JP) .................. 2002-329568

(51) Int. Cl.[7] .............. H03B 5/32; H03B 5/36
(52) U.S. Cl. ................ 331/107 A; 331/117 R; 331/179
(58) Field of Search .............. 331/34, 107 A, 331/177 R, 179

(56) References Cited

U.S. PATENT DOCUMENTS 5,475,391 A * 12/1995 Spencer ............... 342/62

FOREIGN PATENT DOCUMENTS

| JP | 07-297640 | 11/1995 |
|---|---|---|
| JP | 08-213838 | 8/1996 |
| JP | 2002-290153 | 10/2002 |
| JP | 2002-335127 | 11/2002 |
| JP | 2002-359521 | 12/2002 |

* cited by examiner

Primary Examiner—David Mis
(74) Attorney, Agent, or Firm—Harness, Dickey & Pierce, P.L.C.

(57) ABSTRACT

A voltage-controlled oscillator includes a voltage-controlled phase-shift circuit for outputting a signal in which the phase of an input signal is shifted by a predetermined amount in accordance with an external control voltage; a plurality of SAW resonators, each of which resonates at a predetermined resonance frequency; switching means for selecting one of the plurality of SAW resonators in accordance with the external control signal; frequency selection means for selecting a predetermined resonance frequency from the selected SAW resonator; an oscillation differential amplifier for amplifying the resonance signal of the predetermined resonance frequency; and a feedback-buffer differential amplifier for inputting the output signal from the oscillation differential amplifier, wherein the voltage-controlled phase-shift circuit, the selected SAW resonator, the frequency selection means, the oscillation differential amplifier, and the feedback-buffer differential amplifier form a positive-feedback oscillation loop.

16 Claims, 18 Drawing Sheets

$fs1 = 1 / (2\pi\sqrt{(L(C+C1))})$ $fs2 = 1 / (2\pi\sqrt{(L(C+C2))})$ f1: RESONANCE FREQUENCY OF FIRST SAW RESONATOR f2: RESONANCE FREQUENCY OF SECOND SAW RESONATOR

VOLTAGE-CONTROLLED OSCILLATOR AND ELECTRONIC DEVICE USING SAME

BACKGROUND OF THE INVENTION

1. Technical Field of the Invention

The present invention relates to a voltage-controlled oscillator and an electronic device using the same. More particularly, the present invention relates to a voltage-controlled oscillator incorporating a plurality of SAW resonators, one of the plurality of SAW resonators is selected in accordance with a control signal, and the oscillation frequency is varied in accordance with a control voltage, and to an electronic device using the voltage-controlled oscillator.

2. Related Art

In telecommunications devices such as cellular phones, communication data is transmitted and received based on the clock signal from an oscillator. Communication networks have advanced toward broadband services, the demand of the market has moved to a high-frequency band exceeding 400 MHz, and in this high-frequency band, data is transmitted and received. In electronic devices, including communication devices in recent years, there has been a demand for high-frequency oscillators for providing higher communication speed with good frequency stability at a high-frequency band, temperature be compensated for in the practical temperature range of the communication device, and jitter of the clock signal output from the high-frequency oscillator be small. In particular, in a high-speed network market, such as Ethernet (registered trademark) using a gigabit band and a fiber channel, which have shown rapid growth in recent years, in order to prevent communication error from occurring which results from jitter of the high-frequency oscillator, there has been a demand for a highly stabilized high-frequency oscillator in which jitter is very small.

At present, there is an optical fiber communication system of 10 Gbit/s which has been put to practical use, for example, the SONET (Synchronous Optical NETwork) method in the United States. In this optical fiber communication system of 10 Gbit/s, several frequencies are used due to the difference of the data structure to be transmitted and received, four nearby frequencies exist in the band of 600 MHz, and high-frequency oscillators corresponding to respective frequencies are necessary. The difference of these frequencies is chiefly due to the difference of the number of bits of transmission data added by the error correction function for identifying the presence or absence of the error data generated on the transmission line and the difference in the structure of the transmission and reception data according to the method. Specifically, there are frequencies of 622.08 MHz, 644.53125 MHz, 666.51429 MHz, and 669.32658 MHz.

As conventional voltage-controlled oscillators, those shown in FIGS. 20 and 21 are known.

FIG. 20 is a block diagram of a voltage-controlled oscillator (VCO) 1G which consists of a parallel resonance circuit using an LC. This voltage-controlled oscillator (VCO) 1G comprises a Colpitts-type oscillation circuit 80 having a parallel resonance circuit 83 which is a feedback section, a multiplier circuit 81, and a differential conversion circuit 82. The Colpitts-type oscillation circuit 80 is composed of an NPN-type bipolar transistor (not shown), etc., and the parallel resonance circuit 83 is composed of an inductor L, a capacitor C, and a variable capacitance diode Cv. By controlling the variable capacitance value of the variable capacitance diode Cv in accordance with a control voltage Vc, the oscillation frequency varies. The oscillation output from the Colpitts-type oscillation circuit 80 is further multiplied to a desired frequency, for example, 622.08 MHz at the multiplier circuit 81, and the oscillation output is output as a clock signal at the differential conversion circuit 82 from which a differential signal can be extracted from one input signal.

FIG. 21 is a block diagram showing the configuration of a conventional voltage-controlled crystal oscillator 1H using an AT-cut crystal vibrator. This voltage-controlled crystal oscillator (VCXO) 1H comprises an oscillation section 85 formed of an AT-cut crystal vibrator which vibrates at several tens of MHz, the voltage-controlled phase-shift circuit 84, and the Colpitts-type oscillation circuit 80; the multiplier circuit 81; and the differential conversion circuit 82. In the oscillation section 85, the external control voltage Vc is input into the voltage-controlled phase-shift circuit 84 so that the oscillation frequency can be varied within a fixed range.

In a conventional voltage-controlled crystal oscillator (VCXO), the oscillation section 85 can also be formed so as to be replaced with a multi-frequency switching-type oscillator for selecting a signal from a plurality of piezoelectric vibrators (crystal vibrators) by using the switching control circuit shown in, for example, Japanese Unexamined Patent Application Publication No. 7-297640 (Paragraph 0013, FIG. 1).

As a conventional voltage-controlled oscillator, for example, there is a voltage-controlled oscillator in which, as shown in Japanese Unexamined Patent Application Publication No. 8-213838 (Paragraph 0006, FIG. 1), a plurality of SAW resonators are switched by a switch so as to achieve a broader band with low noise.

The above-described voltage-controlled high-frequency oscillator has problems such as those described below.

The voltage-controlled oscillator (VCO) 1G shown in FIG. 20 has problems in that, because the Q value of a parallel resonance circuit using a coil and a capacitor is very small, a lot of jitter occurs, and thus system specification concerning the jitter of the SONET method cannot be satisfied.

On the other hand, when the voltage-controlled crystal oscillator (VCXO) 1H using an AT-cut crystal vibrator having a high Q value, shown in FIG. 21, is used, there are problems in that the change in the frequency of the AT-cut crystal vibrator remains about several hundreds of KHz, and it is not possible for a high-speed optical communication system to be used to deal with multi-rate.

Next, in the AT-cut crystal vibrator described in FIG. 21 and JP 7-297640, if, in addition to main vibration, sub-vibration exists nearby, when the temperature condition changes, the sub-vibration is further brought closer to the main vibration and is likely to be coupled therewith. Furthermore, in addition to the necessary vibration, unwanted spurious signals exist. The multiplier circuit 81 employs a method in which multiplication is achieved based on the main vibration possessed by the AT-cut crystal vibrator, that is, harmonics are generated and only the necessary harmonics are obtained as a harmonic signal. For this reason, unwanted spurious signals caused by the coupling of the main vibration and the sub-vibration of the AT-cut crystal vibrator and those vibrations become a factor for causing jitter to be generated. Furthermore, in the multiplier circuit 81, unwanted harmonics other than the high-frequency signal generated on the basis of the main vibration of the AT-cut crystal vibrator become a factor for causing jitter to be generated. Therefore, there is a problem in that those generation factors become noise, causing jitter to be increased.

The conventional voltage-controlled oscillators 1G and 1H are formed of the Colpitts-type oscillation circuit 80, the multiplier circuit 81, and the differential conversion circuit 82, and require many parts. Consequently, they are larger, presenting the problem of being contrary to the demand for ultra miniaturization and lower costs in recent years.

According to JP 8-213838, a configuration in which a plurality of SAW resonators are switched by a switch is employed. However, since control from an external source cannot be performed, there is a problem in that, once the SAW resonator is selected, a change after that cannot be performed.

Also, in the configuration shown in JP 8-213838, there is a problem in that, as shown in FIG. 22, the control voltage-oscillation frequency variable characteristics vary greatly due to the influence of (1) the temperature characteristics of a varicap diode, in particular, large variations in a low reverse voltage (a large capacitance value), (2) temperature-phase characteristic of active elements, and (3) temperature characteristics of passive elements such as coils and capacitors. That is, in the temperature characteristics of the oscillation frequency shown in FIG. 22(a), in particular, in a high temperature region, large variations in the oscillation frequency can be seen conspicuously. Similarly, also, in FIG. 22(b), large variations in the oscillation frequency can be seen in a high temperature region. These are problems which appear conspicuously in a voltage-controlled SAW oscillator (VCSO) using a SAW resonator.

In addition, when an oscillator is to be provided for each frequency used, there are problems in that design and manufacture become necessary for each model and, in order to respond instantly to an order from the system provider who requires this oscillator, the oscillator must be always in stock.

The present invention has been made to solve the above-described problems. An object of the present invention is to obtain a voltage-controlled oscillator capable of selectively causing several types of frequencies to oscillate under external control without using an LC parallel resonance circuit having a low Q value or an AT-cut crystal vibrator having unwanted sub-vibration and spurious signals in the oscillation section of the voltage-controlled oscillator. Another object of the present invention is to obtain a voltage-controlled oscillator whose size and cost are reduced and in which the amount of jitter is small without using a multiplier circuit and a differential conversion circuit. Another object of the present invention is to obtain a voltage-controlled oscillator in which the temperature characteristics of the oscillation frequency is improved, in particular, improvements are made in a high temperature region. Another object of the present invention is to obtain a voltage-controlled oscillator which can be used by making a selection from a plurality of oscillation frequencies without designing or manufacturing for each frequency.

In addition, another object of the present invention is to obtain an electronic device using a voltage-controlled oscillator which is capable of selecting a frequency according to the specification of the network system and in which the amount of jitter is small, and miniaturization and lower costs are achieved, for example, an optical network communication device.

SUMMARY

The voltage-controlled oscillator of the present invention comprises: a voltage-controlled phase-shift circuit for outputting an output signal in which the phase of an input signal is shifted by a predetermined amount in accordance with an external control voltage; a plurality of SAW resonators, each of which resonates at a predetermined resonance frequency; first switching means for selecting one of the plurality of SAW resonators in accordance with the external control signal; frequency selection means for selecting an output signal having a predetermined resonance frequency from one SAW resonator among the plurality of SAW resonators which is selected by the first switching means; an oscillation differential amplifier for amplifying and outputting the resonance signal of the predetermined resonance frequency; and a feedback-buffer differential amplifier for inputting the output signal from the oscillation differential amplifier, wherein the voltage-controlled phase-shift circuit, the SAW resonator selected by the first switching means, the frequency selection means, the oscillation differential amplifier, and the feedback-buffer differential amplifier form a positive-feedback oscillation loop.

According to the above-described configuration, a desired resonance frequency is obtained, and one type of voltage-controlled oscillator can cope with individual system specifications with different frequencies in an optical fiber communication system. At the same time, since the frequency selection means corresponding to the selected SAW resonator can eliminate noise due to circuit impedance mismatching and unwanted noise based on abnormal oscillation, there is the advantage that jitter caused by these kinds of noise does not occur.

The voltage-controlled oscillator of the present invention comprises: a voltage-controlled phase-shift circuit for outputting an output signal in which the phase of an input signal is shifted by a predetermined amount in accordance with an external control voltage; a plurality of SAW resonators, each of which resonates at a predetermined resonance frequency; first switching means for selecting one of the plurality of SAW resonators in accordance with the external control signal; frequency selection means for selecting an output signal having a predetermined resonance frequency from one SAW resonator among the plurality of SAW resonators, which is selected by the first switching means; an oscillation amplifier for amplifying and outputting the predetermined resonance signal selected by the frequency selection means; a feedback-buffer amplifier for inputting the output signal from the oscillation amplifier; and a plurality of output amplifiers for inputting a signal from the oscillation amplifier and outputting an output signal, wherein the voltage-controlled phase-shift circuit, the SAW resonator selected by the first switching means, the frequency selection means, the oscillation amplifier, and the feedback-buffer amplifier form a positive-feedback oscillation loop.

According to the above-described configuration, a desired frequency can be obtained, and one type of voltage-controlled oscillator can cope with individual system specifications with different frequencies in an optical fiber communication system. At the same time, since the frequency selection means can eliminate noise due to circuit impedance mismatching and unwanted noise based on abnormal oscillation, jitter caused by those noises does not occur. Furthermore, since a plurality of output amplifiers are provided inside an integrated circuit, it is not necessary to add external parts, such as a driver IC for output buffer, in the output of the voltage-controlled oscillator, presenting the advantages that miniaturization and lower costs can be achieved.

In the voltage-controlled oscillator of the present invention, the frequency selection means is formed as an LC parallel resonance circuit having an inductance element and a capacitance element, there is provided a passive element connected in series between one end of each of the plurality of SAW resonators and a ground, and when one of the plurality of SAW resonators is selected, the passive element connected in series to the selected SAW resonator is connected in parallel to the LC parallel resonance circuit.

According to the above-described configuration, since it is not necessary to provide switching means for switching in the unit of the LC parallel resonance circuit corresponding to the selected SAW resonator and for individually selecting a passive element, there are advantages that the number of parts can be reduced, and the voltage-controlled oscillator can be reduced in size.

In the voltage-controlled oscillator of the present invention, the frequency selection means is formed as an LC parallel resonance circuit having an inductance element and a capacitance element, there are provided: second switching means; and a passive element connected in series between one end of the second switching means and a ground, and when one of the plurality of SAW resonators is selected, the passive element selected by the second switching means, corresponding to the selected SAW resonator, is connected in parallel to the LC parallel resonance circuit.

According to the above-described configuration, since it is not necessary to switch in the unit of the LC parallel resonance circuit corresponding to the selected SAW resonator, there are advantages that an inductance element (inductor) does not need to be provided, and the voltage-controlled oscillator can be miniaturized.

In the voltage-controlled oscillator of the present invention, the frequency selection means is formed as an LC parallel resonance circuit having an inductance element and a variable capacitance element, and there is provided control voltage generation means for generating a control voltage for controlling the capacitance of the variable capacitance element in accordance with an external control signal.

According to the above-described configuration, the frequency selection means (the LC parallel resonance circuit) employs a simple configuration composed of an inductance element (inductor) and a variable capacitance element (variable capacitance diode). For this reason, there is no need to arrange a plurality of individual capacitance elements (capacitors) and to make many long wires between the capacitor elements and the inductance elements. As a result, since stray capacitance, etc., which can be present in a wire line between a plurality of capacitance elements and inductor elements, does not occur, there is the advantage that adverse influence exerted on the characteristics of the LC parallel resonance circuit can be eliminated.

In the voltage-controlled oscillator of the present invention, there is provided signal selection means for selecting, as the positive-feedback oscillation loop, one of the output terminals of the feedback-buffer differential amplifier having an inverting output terminal and a non-inverting output terminal.

According to the above-described configuration, since one of two signals having mutually different phases, which are output from the feedback-buffer differential amplifier, can be selected, the adjustable amount of phase shift in the voltage-controlled phase-shift circuit can be set to be small. As a result, since there is no need to provide a plurality of voltage-controlled phase-shift circuits according to the frequency band used, there are advantages that the voltage-controlled oscillator can be reduced in size and the cost thereof can be lowered.

In the voltage-controlled oscillator of the present invention, the differential amplifier is a differential amplifier circuit using an ECL line receiver.

According to the above-described configuration, since formation into an integrated circuit can be made easier, there are advantages that the voltage-controlled oscillator can be reduced in size, the power consumption thereof can be lowered, and the voltage-controlled oscillator can be made to operate at a high speed.

In the voltage-controlled oscillator of the present invention, in the above-described configuration, the passive element connected in parallel to the LC parallel resonance circuit is a capacitance element.

According to the above-described configuration, when one of the plurality of the SAW resonators is selected, since, as a passive element corresponding thereto, a simple capacitor element is connected in parallel to an LC parallel resonance circuit, there is the advantage that the frequency selectivity of the LC parallel resonance circuit can be easily changed.

In the voltage-controlled oscillator of the present invention, the frequency selection means comprises an NTC thermistor having negative temperature characteristics.

According to the above-described configuration, the control voltage-oscillation frequency characteristics of the voltage-controlled oscillator are greatly improved in a wide temperature range, in particular, in a higher temperature region. As a result, since variations of the oscillation frequency due to temperature can be lessened, even if the ambient temperature becomes high, there is the advantages that a voltage-controlled oscillator in which the frequency is stable can be obtained.

The electronic device of the present invention comprises a voltage-controlled oscillator as set forth in the foregoing.

According to the above-described configuration, an LC parallel resonance circuit is simply formed for each SAW resonator to be used, and a highly stabilized voltage-controlled oscillator in which unwanted jitter is greatly reduced is used, thereby ensuring a timing margin between transmission and reception data and the clock signal. As a result, if the voltage-controlled oscillator in accordance with the present invention is applied to an electronic device, for example, an optical interface module, it is possible to stably transmit and receive data via an optical network without malfunction. Furthermore, the voltage-controlled SAW oscillator (VCSO) of the present invention is able to selectively switch the resonance frequencies of a plurality of SAW resonators under external control. Therefore, if one voltage-controlled SAW oscillator (VCSO) is installed, the oscillation frequency can be switched from the system side according to the specification of the system. At the same time, since there is no need to provide a plurality of individual voltage-controlled SAW oscillators (VCSO) whose frequencies differ from each other, there is the advantage that an optical interface module in which miniaturization and lower costs are achieved can be provided.

DETAILED DESCRIPTION

First Embodiment

A first embodiment will now be described.

Configuration of the First Embodiment

Configuration of Voltage-Controlled SAW Oscillator

Figure 1:
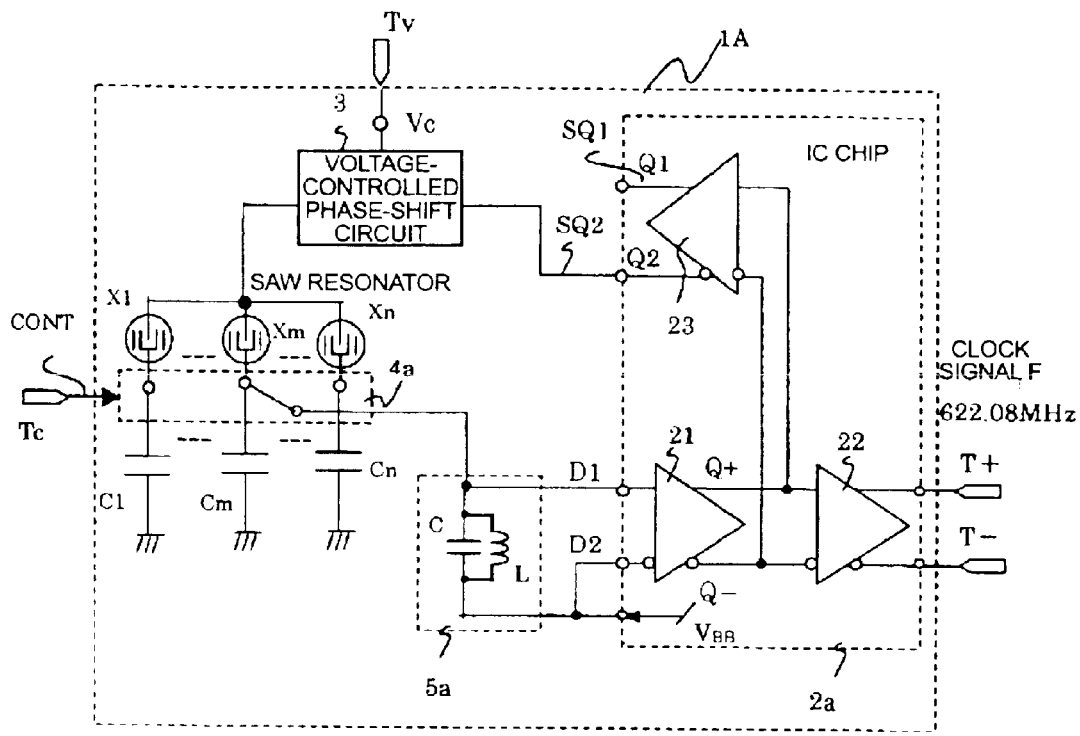
FIG. 1 is a block diagram showing the configuration of a voltage-controlled SAW oscillator in a first embodiment of the present invention.

FIG. 1 is a block diagram showing the configuration of a voltage-controlled SAW oscillator (VCSO) 1A according to the first embodiment of the present invention.

The voltage-controlled SAW oscillator (VCSO) 1A comprises an IC chip 2a incorporating therein an oscillation differential amplifier 21, a differential amplifier 22 for output, and a feedback-buffer differential amplifier 23; a voltage-controlled phase-shift circuit 3 for adjusting the phase of an input signal by shifting it by a predetermined amount on the basis of an external control voltage Vc; a plurality of SAW resonators X1 to Xn each having a predetermined resonance frequency; a switch (first switching means) 4a for performing an on/off operation in accordance with an external control signal; and an LC parallel resonance circuit (frequency selection means) 5a formed of an inductor L and a capacitor C. A reference bias voltage VBB, which is output from the IC chip 2a, is supplied, external to the IC chip 2a, to an inverting input terminal D2 of the oscillation differential amplifier 21. Next, one SAW resonator Xm (m=1 to n) selected by at least one of the oscillation differential amplifier 21, the feedback-buffer differential amplifier 23, the voltage-controlled phase-shift circuit 3, and the switch 4a; and the LC parallel resonance circuit 5a form a positive-feedback oscillation loop.

Hereafter, the selected SAW resonator will be represented as a SAW resonator Xm.

The SAW resonator is formed in such a manner that interdigitated excitation electrodes and ladder-shaped reflectors are arranged on a piezoelectric substrate, and functions as a resonator by causing a standing wave to occur by reflecting using a reflector a surface-acoustic wave excited by the excitation electrode. Furthermore, since a resonance point does not exist at a frequency other than a predetermined frequency, unwanted noise does not occur from the SAW resonator itself, presenting the advantage that jitter resulting from this noise does not occur. The resonance frequency of the SAW resonator is several hundreds of MHz to several GHz, and the SAW resonator is used for a high-frequency oscillation circuit.

Figure 2:
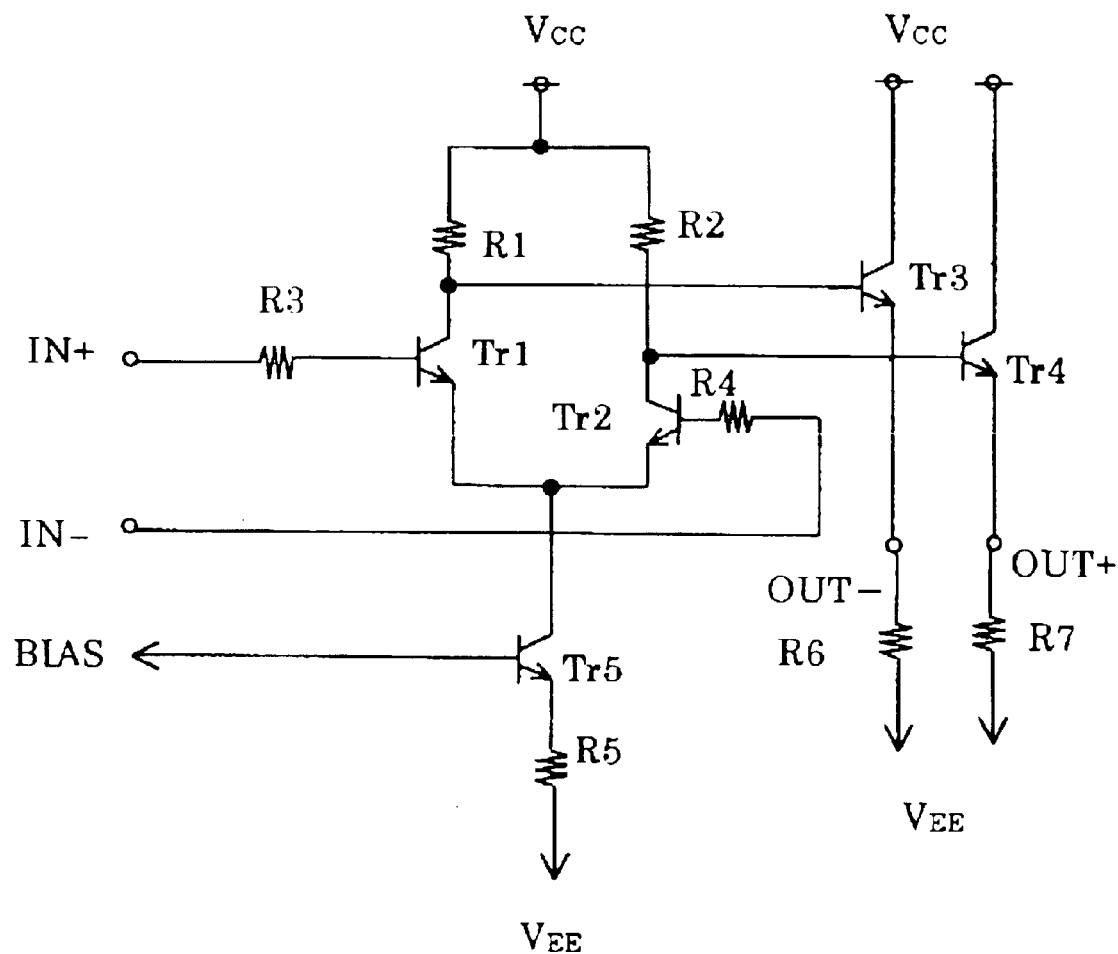
FIG. 2 is a circuit diagram showing the circuit configuration of an ECL line receiver.

The above-described three differential amplifiers 21 to 23 are differential amplifier circuits using an ECL (Emitter-Coupled Logic) line receiver shown in FIG. 2. Since the ECL line receiver has low power consumption and can operate at a high speed, it is used for a high-frequency oscillator. As shown in FIG. 2, since the differential amplifiers 21 to 23 for amplifying a resonance signal from the SAW resonator Xm are formed of a differential amplifier circuit using an ECL line receiver, they can easily be formed as an integrated circuit, and the miniaturization of the voltage-controlled SAW oscillator (VCSO) 1A can be realized.

In the oscillation differential amplifier 21, a signal of a predetermined resonance frequency fm from the SAW resonator Xm is input to a non-inverting input terminal D1 of the oscillation differential amplifier 21. Then, output signals in which the phase difference between them is 180 degrees are output from a non-inverting output terminal Q+ and an inverting output terminal Q−.

The output differential amplifier 22 shapes the waveform of the output signal from the oscillation differential amplifier 21, and outputs it as a clock signal F of a predetermined oscillation frequency, for example, 622.08 MHz.

The feedback-buffer differential amplifier 23 is a differential amplifier having a buffer function, and the output thereof is output to output terminals Q1 and Q2. Then, emitter terminating resistors (not shown), which are externally provided to the IC chip 2a, are connected to the output terminals Q1 and Q2 of the feedback-buffer differential amplifier 23 using the ECL line receiver, respectively.

FIG. 2 shows a state in which the emitter terminating resistors R6 and R7 are connected to the output terminals OUT− and OUT+, respectively.

The voltage-controlled phase-shift circuit 3 adjusts one of output signals SQ1 and SQ2 from the feedback-buffer differential amplifier 23 to a predetermined amount of phase so as to satisfy the phase condition of the voltage-controlled SAW oscillator (VCSO) 1A on the basis of the external control voltage Vc.

Figure 3:
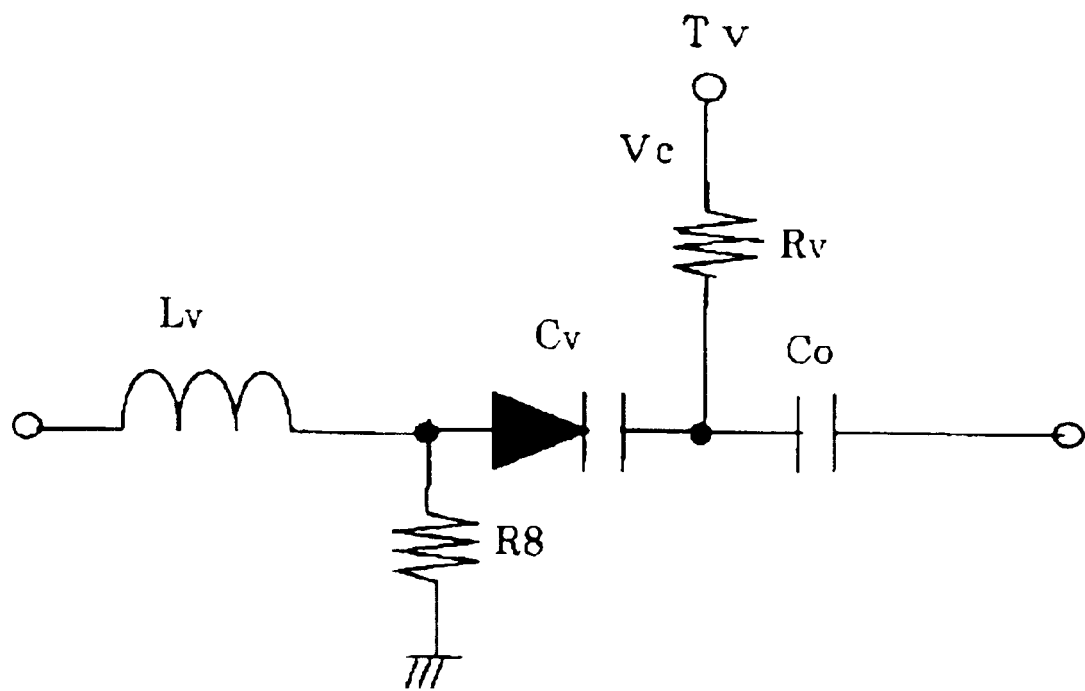
FIG. 3 is a circuit diagram showing the configuration of a voltage-controlled phase-shift circuit in the first embodiment of the present invention.

FIG. 3 is a circuit diagram showing the configuration of the voltage-controlled phase-shift circuit 3.

The LC parallel resonance circuit 5a, as a parallel circuit of the inductor L and the capacitor C, is connected between the respective input terminals D1 and D2 of non-inversion and inversion of the oscillation differential amplifier 21. Then, the LC parallel resonance circuit 5a selects the resonance frequency fm of the selected SAW resonator Xm and outputs it.

Configuration of SAW Resonator and LC Parallel Resonance Circuit

A description will now be given, with reference to FIGS. 1 and 4, of several embodiments concerning the configuration of a plurality of SAW resonators and an LC parallel resonance circuit, which are used in the voltage-controlled SAW oscillator (VCSO) 1A of the first embodiment.

Embodiment 1

Embodiment 1 will be described first with reference to FIG. 1.

In FIG. 1, a switch 4a is connected to one end of each of the plurality of SAW resonators X1 to Xn, and the LC parallel resonance circuit 5a is connected to the other end of the switch 4a. The SAW resonator Xm, which is one of the plurality of SAW resonators X1 to Xn, is selected in accordance with a control signal CONT which is externally input via an input terminal Tc. As a result of this selection, the predetermined resonance frequency described above, for example, one of 622.08 MHz, 644.53125 MHz, 666.51429 MHz, and 669.32658 MHz, is obtained.

Each terminal of the plurality of SAW resonators X1 to Xn and one end of the capacitors C1 to Cn (passive elements) are connected in series via the switch 4a, and the other ends of the capacitors C1 to Cn are grounded. This configuration is such that, at the same time when the SAW resonator Xm, which is one of the SAW resonators X1 to Xn, is selected, a capacitor Cm (m=1 to n) corresponding thereto is connected in parallel to the LC parallel resonance circuit 5a.

Hereafter, similarly to the SAW resonator, the capacitor Cm represents a selected capacitor.

Here, a modification in which the configuration shown in FIG. 1 is partly changed is described.

Figure 4:
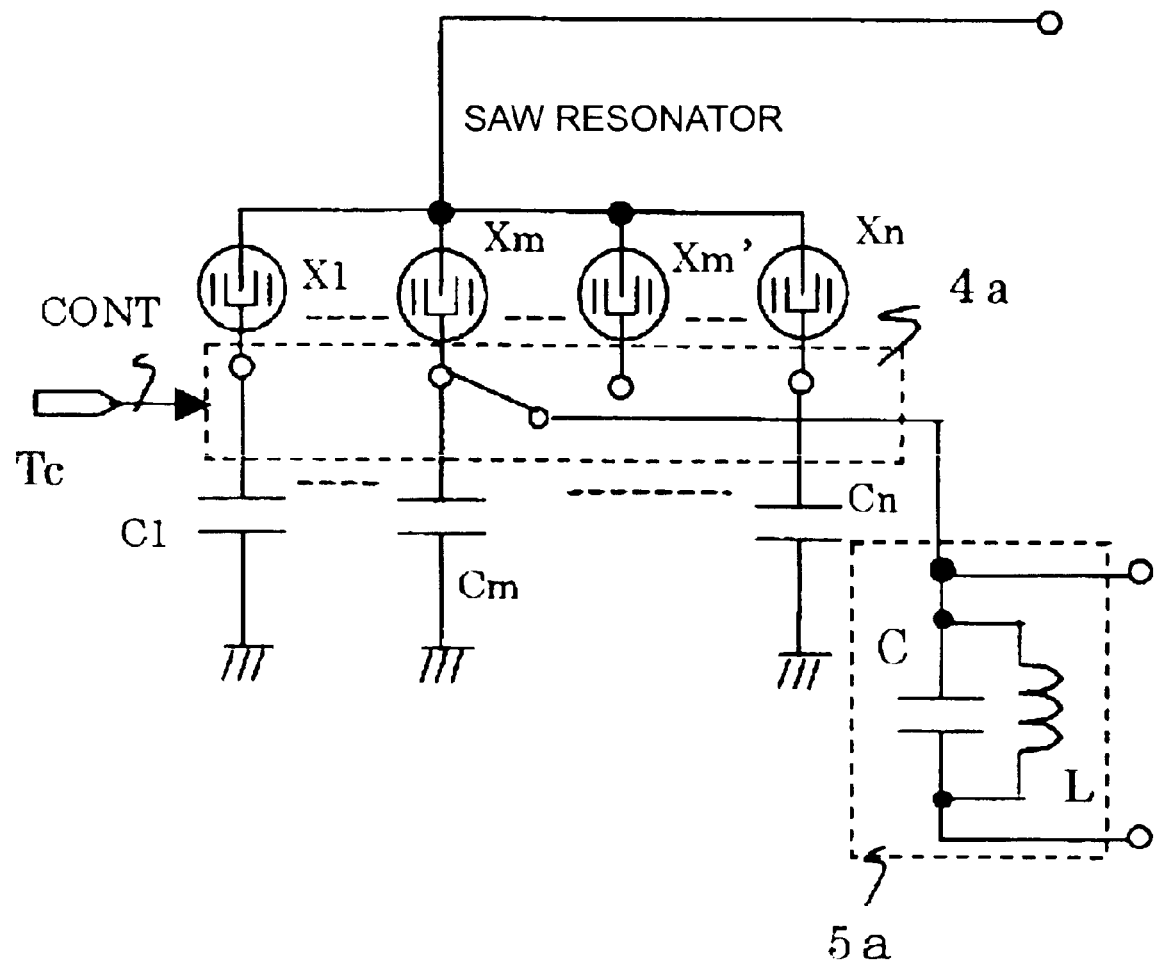
FIG. 4 shows a modification of embodiment 1 of the first embodiment of the present invention.

FIG. 4 shows a modification of the basic configuration of the SAW resonator and the LC parallel resonance circuit 5a. As shown in FIG. 4, a capacitor Cm' which is connected in series to the SAW resonator Xm' (m'=1 to n) is not provided so as to make common use with the capacitor C of the LC parallel resonance circuit 5a. As a result, the number of capacitors can be reduced by one in comparison with the configuration of FIG. 1.

As described in the forgoing, embodiment 1 is such that switching is performed in the configuration in which the SAW resonator Xm and the capacitor Cm are connected in series. As a result of this configuration, when compared to the configuration in which switching is performed for each parallel resonance circuit formed of an inductor and a capacitor, parts for a plurality of inductors are not needed. Furthermore, since there is no need to provide a switch for selection in each unit of the individual capacitors C1 to Cn shown in embodiment 2 (see FIG. 5) (to be described later), the switch does not need to be provided, and the voltage-controlled oscillator can be miniaturized.

Embodiment 2

Embodiment 2 will now be described below with reference to FIG. 5.

Figure 5A:
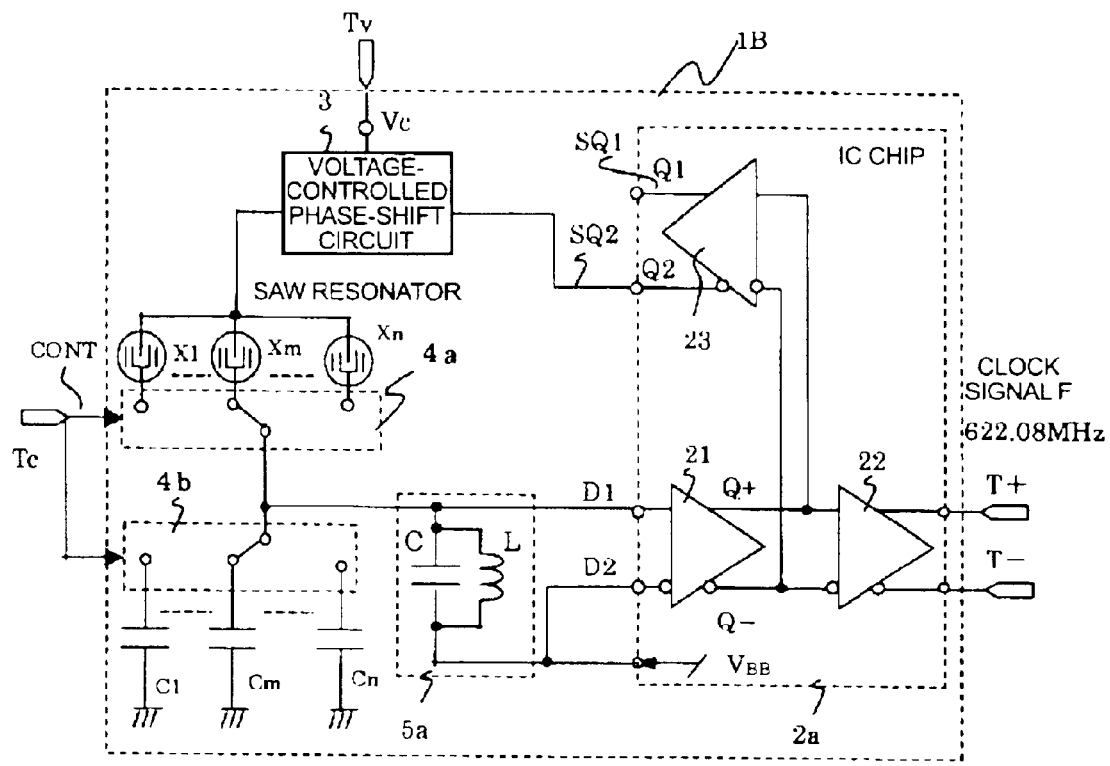
FIG. 5 includes block diagrams showing the configuration of embodiment 2 of a voltage-controlled SAW oscillator in the first embodiment of the present invention.

FIG. 5(a) shows the case of a configuration when this is formed of the capacitors C1 to Cn to be added and a switch 4b. That is, in FIG. 5(a), embodiment 2 comprises SAW resonators X1 to Xn, a switch 4a for selecting one of them, a plurality of capacitors C1 to Cn, a switch 4b (second switching means) for selecting one of them, and an LC parallel resonance circuit 5a. Next, a capacitor Cm corresponding to the selected SAW resonator Xm is selected by the switch 4b in accordance with the external control signal CONT, and this capacitor Cm is further connected in parallel to the inductor L, forming an LC parallel resonance circuit 5a.

Figure 5B:
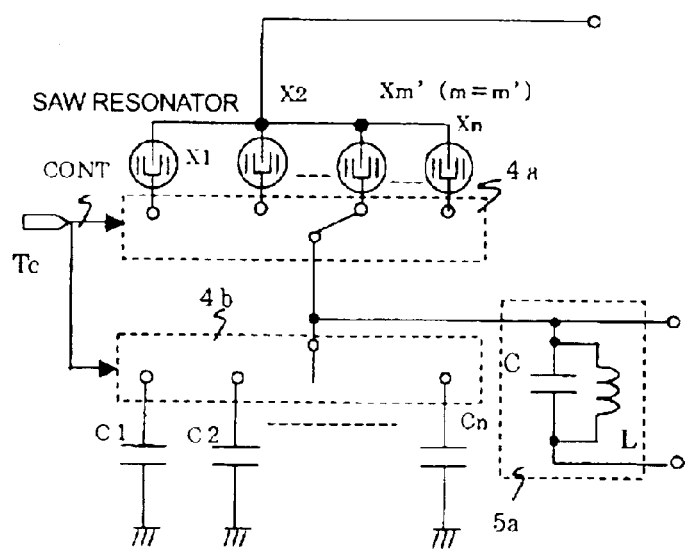

FIG. 5(b) shows a modification of embodiment 2 in the first embodiment.

As shown in FIG. 5(b), a capacitor Cm' (m'=1 to n), which is one of the plurality of capacitors C1 to Cn, is not provided so as to make common use with the capacitor C. FIG. 5(b) shows a case in which a SAW resonator Xm' (m m') which is not associated with a capacitor is selected. As a result, the number of capacitors can be reduced by one in comparison with the configuration of FIG. 5(a).

As described in the forgoing, embodiment 2 is such that one capacitor Cm selected from the capacitors C1 to Cn is further added to the inductor L of the LC parallel resonance circuit 5a. As a result of this configuration, when compared to the configuration in which switching is performed for each parallel resonance circuit formed of an inductor and a capacitor, parts for a plurality of inductors are not needed, and the voltage-controlled oscillator can be reduced in size.

In embodiment 2, a description is given of the configuration in which each of the capacitors C1 to Cn is connected in series to the switch 4b. However, even if the switch 4b is connected to each of the capacitors C1 to Cn, and one end of the switch 4b is grounded, the same advantages are obtained.

Switching means of the switches 4a and 4b can be realized by any means, such as a diode switch, a switching transistor, or a multiplexer.

Role of LC Parallel Resonance Circuit

A description will now be given, with reference to FIG. 6, of the role of the LC parallel resonance circuit 5a to which the selected capacitor Cm is connected in parallel and its frequency characteristics. Here, for the sake of description, a case in which two SAW resonators in the configuration shown in FIG. 1 is described.

The resonance frequencies of the SAW resonators X1 and X2 are denoted as f1 and f2, respectively. The resonance frequency fs1 of the LC parallel resonance circuit 5a when the SAW resonator X1 is selected, with the capacitor C1 being added, is fs1=1/(2π√(L(C+C1))). The resonance frequency fs2 of the LC parallel resonance circuit 5a when the SAW resonator X2 is selected, with the capacitor C2 being added, is fs2=1/(2π√(L(C+C2))). The relationships between these are shown in FIG. 6.

Figure 6:
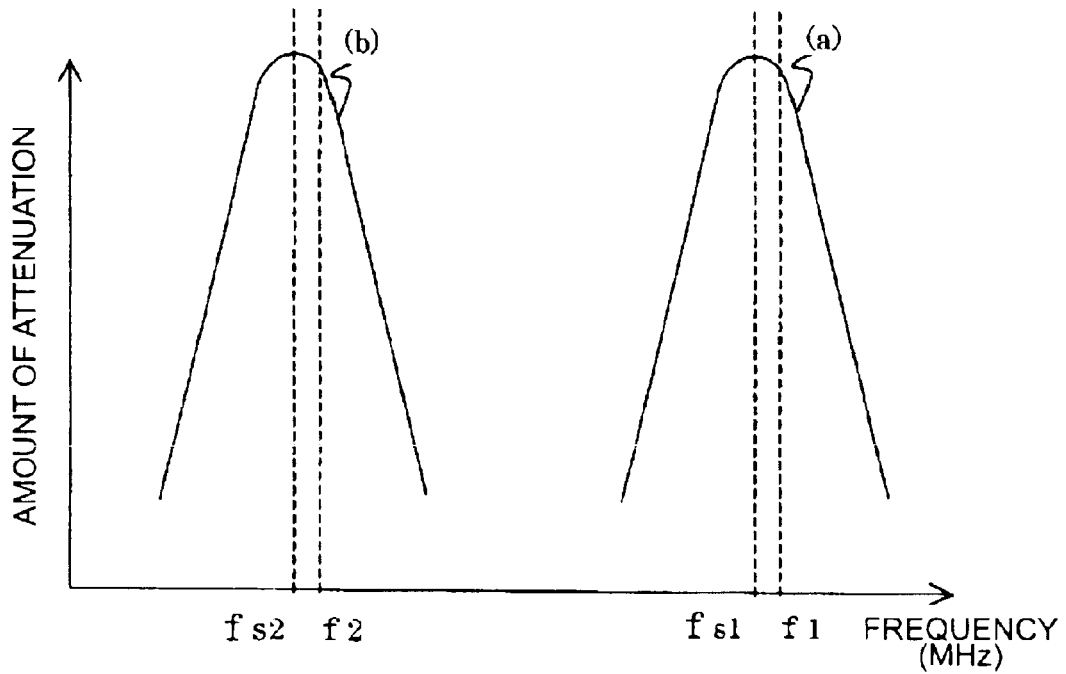
FIG. 6 illustrates frequency characteristics of an LC parallel resonance circuit in the first embodiment of the present invention.

In FIG. 6, for example, the frequency characteristics of the LC parallel resonance circuit 5a in the SAW resonator X1 are represented as (a) with the capacitor C1 being added, and the resonance frequency f1 of the SAW resonator X1 is a frequency which can be selected within the characteristics (a). Similarly, since the capacitor C2 is added when the SAW resonator X2 is selected, the characteristics of the LC parallel resonance circuit 5a at that time moves toward lower frequencies as in (b) (in the case of C2>C1), and the resonance frequency f2 of the SAW resonator X2 is a frequency which can be selected within the characteristics (b).

As described above, the capacitor Cm to be added causes the frequency characteristics of the LC parallel resonance circuit 5a to be changed to characteristics such that the resonance frequency fm of the SAW resonator Xm corresponding thereto can be selected.

The reason for providing this LC parallel resonance circuit is that unwanted frequencies are eliminated. That is, the voltage-controlled SAW oscillator (VCSO) 1A for a high frequency using the SAW resonator which resonates at several hundreds of MHz forms a feedback circuit formed of the voltage-controlled phase-shift circuit 3, the LC parallel resonance circuit 5a, and the differential amplifiers 21 and 23, including the SAW resonators X1 to Xn. Unwanted harmonics exist, for example, a high-frequency oscillation signal is distorted due to the fact that the impedance matching characteristic cannot be taken sufficiently in this feedback circuit.

Figure 7:
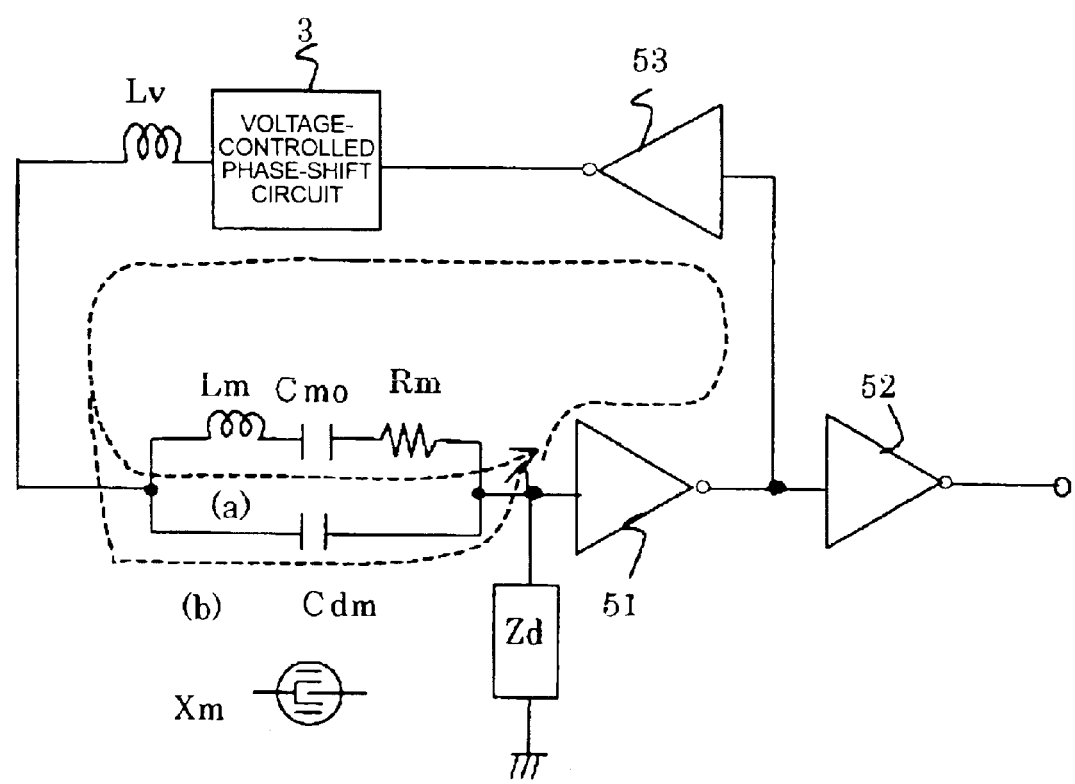
FIG. 7 illustrates a positive-feedback oscillation loop of the voltage-controlled SAW oscillator in the first embodiment of the present invention.

FIG. 7 shows an equivalent circuit of the voltage-controlled SAW oscillator (VCSO) 1A when the SAW resonator Xm is equivalently represented by a circuit symbol. As shown in FIG. 7, in addition to the regular positive-feedback oscillation loop (a), a positive-feedback oscillation loop (b) based on the interelectrode capacitance Cdm (m=1 to n) of the SAW resonator Xm exists in this feedback circuit. Abnormal oscillation resulting from this positive-feedback oscillation loop (b) which is not regular occurs, and therefore, it is necessary to cause the voltage-controlled oscillator itself to have frequency sensitivity in order to eliminate those unwanted frequencies. That is, the LC parallel resonance circuit 5a is made to have this function, and as a result, as described in FIG. 6, the resonance frequency fm of the SAW resonator Xm is selected. On the other hand, noises such as the above-described unwanted harmonics and abnormal oscillation can be eliminated.

Advantages obtained from the first embodiment

Advantages obtained from the first embodiment of the present invention will now be described below.

According to the first embodiment, a plurality of SAW resonators and a switch for selecting one of them are provided, and one of the plurality of SAW resonators is selected in accordance with a control signal which is externally input via an input terminal. This selection makes it possible to obtain a predetermined resonance frequency according to the specification of the system, and the advantage that one type of voltage-controlled oscillator can cope with individual systems with different specifications in an optical fiber communication system can be obtained.

Furthermore, since one type of voltage-controlled oscillator needs only to be designed and manufactured, the advantage that the inventory management is easy can be obtained.

Furthermore, since the voltage-controlled oscillator comprises an LC parallel resonance circuit having frequency sensitivity, occurrence of noise due to circuit impedance mismatching and unwanted noise resulting from abnormal oscillation due to a positive-feedback oscillation loop which is not regular can be eliminated. As a result, only the resonance frequency of the SAW resonator is selected, those noises are eliminated, and the advantage that jitter resulting from these noises does not occur is obtained.

Furthermore, a configuration in which, when one of the plurality of SAW resonators is selected, a capacitor corresponding to this is connected in parallel to the LC parallel resonance circuit, is employed. For this reason, the advantage that the selection characteristics of the LC parallel resonance circuit can be easily changed in accordance with the resonance frequency of the selected SAW resonator is obtained.

Since switching in the unit of the LC parallel resonance circuit formed of an inductor and a capacitor needs not to be performed, a plurality of inductor parts can be reduced, and the advantage that a larger size of the voltage-controlled oscillator can be suppressed is obtained.

Since, in the SAW resonator, sub-vibration as in an AT-cut crystal vibrator does not occur, the sub-vibration is not coupled with main vibration, and unwanted spurious signals do not exist. Furthermore, since a multiplier circuit for obtaining a higher frequency is not required, harmonics do not occur. Therefore, the advantage that jitter resulting from those noises does not occur is obtained.

In addition, since a simple configuration can be employed because the multiplier circuit is eliminated, the advantages that a larger size of the voltage-controlled oscillator can be suppressed, and miniaturization and lower costs are achieved are obtained.

Second Embodiment

A second embodiment will now be described below.

Configuration of the second embodiment

Figure 8:
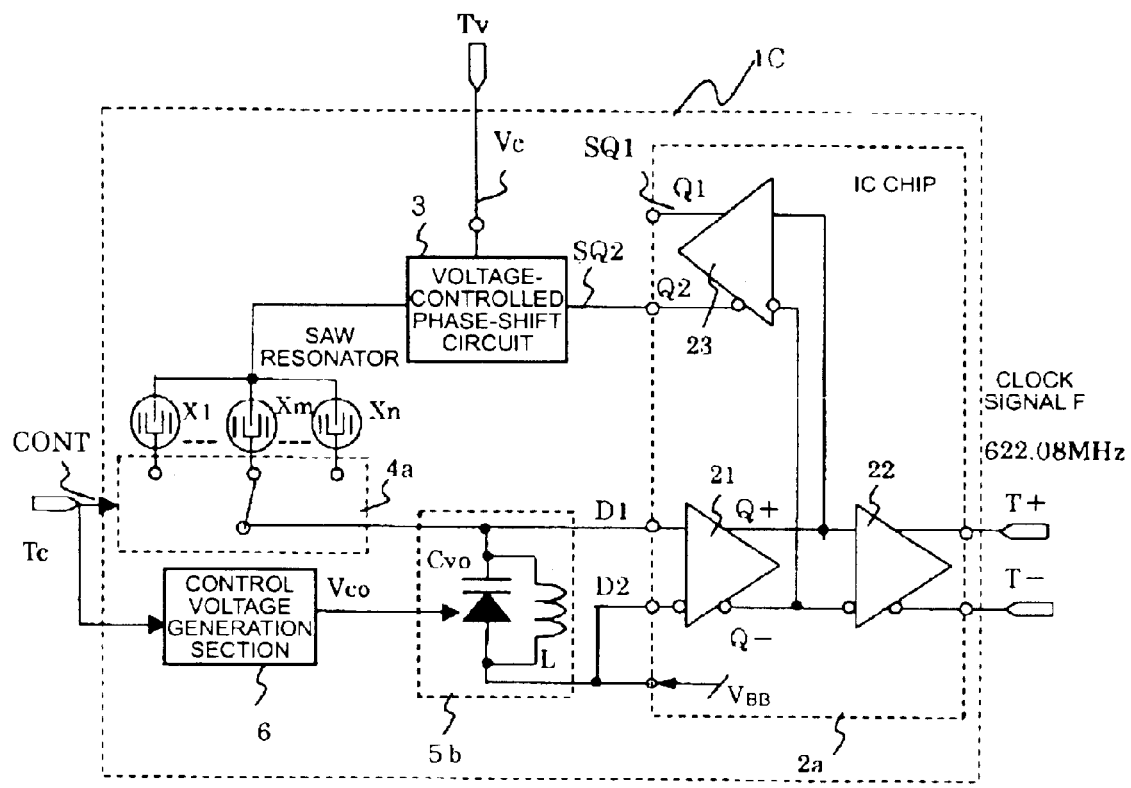
FIG. 8 is a block diagram showing the configuration of a voltage-controlled SAW oscillator in the second embodiment of the present invention.

FIG. 8 is a block diagram showing the configuration of a voltage-controlled SAW oscillator (VCSO) 1C according to the second embodiment of the present invention. The difference from FIG. 1 which shows the first embodiment is that the capacitors C1 to Cn connected to the SAW resonators X1 to Xn are not provided, and an LC parallel resonance circuit 5b formed of a variable capacitance diode (variable capacitance element) Cvo, and a control voltage generation section 6 are provided.

In FIG. 8, the LC parallel resonance circuit 5b is formed of a variable capacitance diode Cvo and an inductor L, inputs a control voltage Vco (to be described later) in order to set the capacitance value of the variable capacitance diode Cvo, and selects a signal having the resonance frequency fm of the selected SAW resonator Xm.

The control voltage generation section 6 generates a control voltage Vco to be supplied to the variable capacitance diode Cvo of the LC parallel resonance circuit 5b, which is required to select a desired resonance frequency of the SAW resonator Xm in accordance with a control signal Vcnt input via the external terminal Tc.

Since the remaining configuration is the same as that of the first embodiment, the same blocks are given the same reference numerals, and accordingly, detailed descriptions thereof are omitted.

The frequency characteristics of this LC parallel resonance circuit 5b are the same as those of individual capacitors having the same capacitance value except that the capacitance value of the variable capacitance diode Cvo is set by the control voltage Vco.

Advantages obtained from the second embodiment

Advantages obtained from the second embodiment of the present invention will now be described below.

According to the second embodiment, since the LC parallel resonance circuit employs a simple configuration formed of a variable capacitance diode and an inductor, a plurality of individual capacitors described in the first embodiment do not need to be provided, and long and many wires between the capacitor and the inductor can be omitted. As a result, since stray capacitance, etc., which can be present in a wire line between a plurality of capacitors and inductors, does not occur, and the advantage that adverse influence exerted on the characteristics of the LC parallel resonance circuit can be eliminated is obtained.

Regarding the other advantages, the same advantages as those of the first embodiment, excluding those advantages related to the LC parallel resonance circuit 5b, are obtained.

Third Embodiment

A third embodiment will now be described below.

Principles of the Third Embodiment

Figure 9:
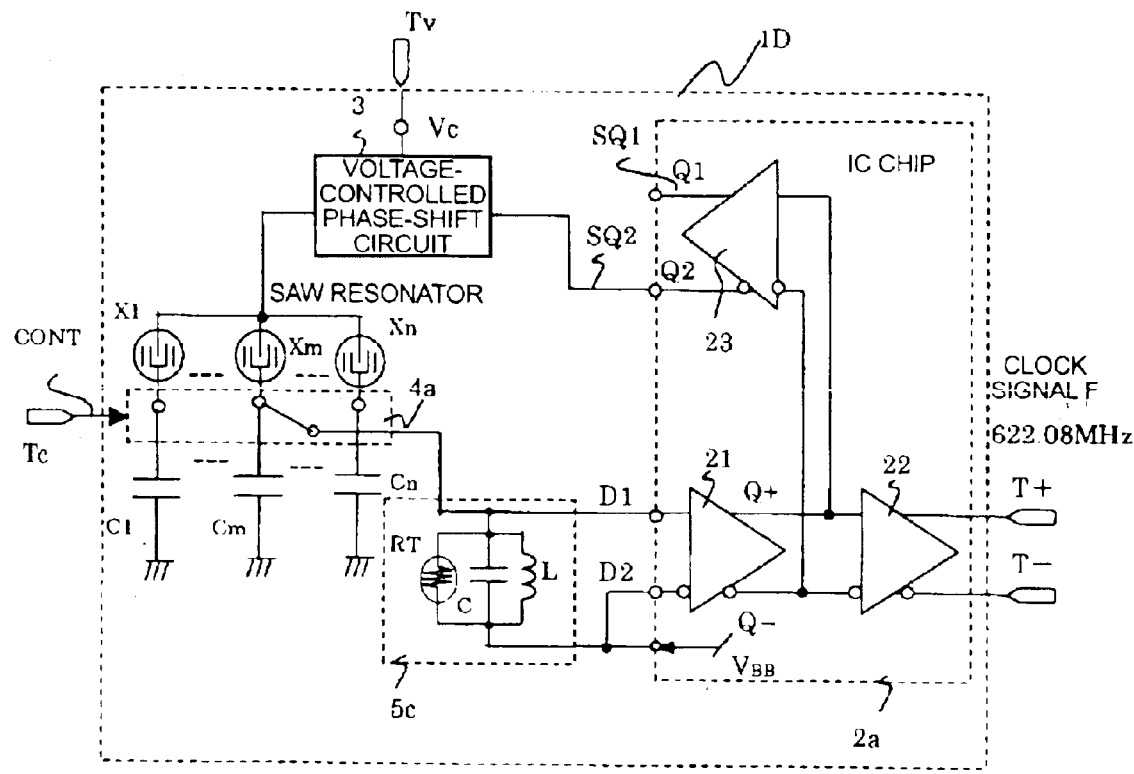
FIG. 9 is a block diagram showing the configuration of a voltage-controlled SAW oscillator in a third embodiment of the present invention.

FIG. 9 is a block diagram showing the configuration of a voltage-controlled SAW oscillator (VCSO) 1D according to the third embodiment of the present invention.

The third embodiment according to the present invention employs a configuration in which an NTC thermistor is connected in parallel to the LC parallel resonance circuit 5a. Since the remaining configuration is the same as the first and second embodiments, descriptions thereof are omitted. The description is given using the configuration based on FIG. 1.

In FIG. 9, usually, reactance is varied by the variable capacitance diode Cv of the voltage-controlled phase-shift circuit 3 shown in FIG. 3 in order to vary the phase of the oscillation loop, thereby obtaining the control voltage-frequency characteristics. That is, the desired oscillation frequency is obtained in accordance with the control voltage applied to the varicap diode.

Figure 22A:
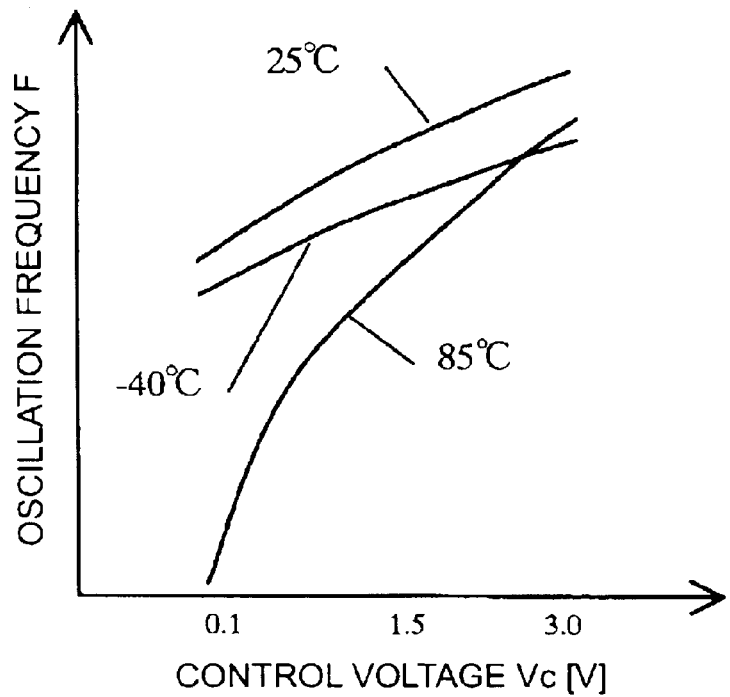
FIG. 22 shows control voltage characteristics and temperature characteristics versus an oscillation frequency obtained by varying a control voltage in a conventional voltage-controlled SAW oscillator.
Figure 22B:
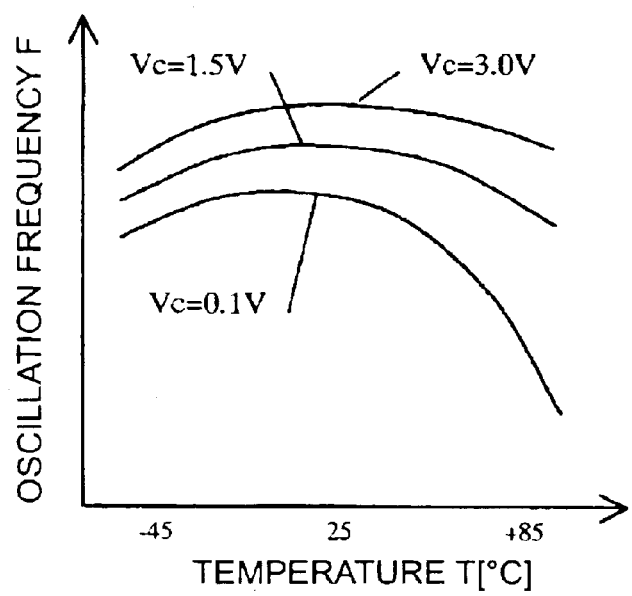

As described in the "Background of the Invention", in the configuration using the selected SAW resonator Xm and the voltage-controlled phase-shift circuit 3, there is a problem in that the control voltage-oscillation frequency characteristics (see FIG. 22) greatly vary particularly in a higher temperature region. Such a problem is reduced by connecting the NTC thermistor RT in parallel to the LC parallel resonance circuit 5a in the first embodiment as shown in FIG. 9. This improvement of the temperature characteristics will be described with reference to FIGS. 10 to 13.

Figure 10:
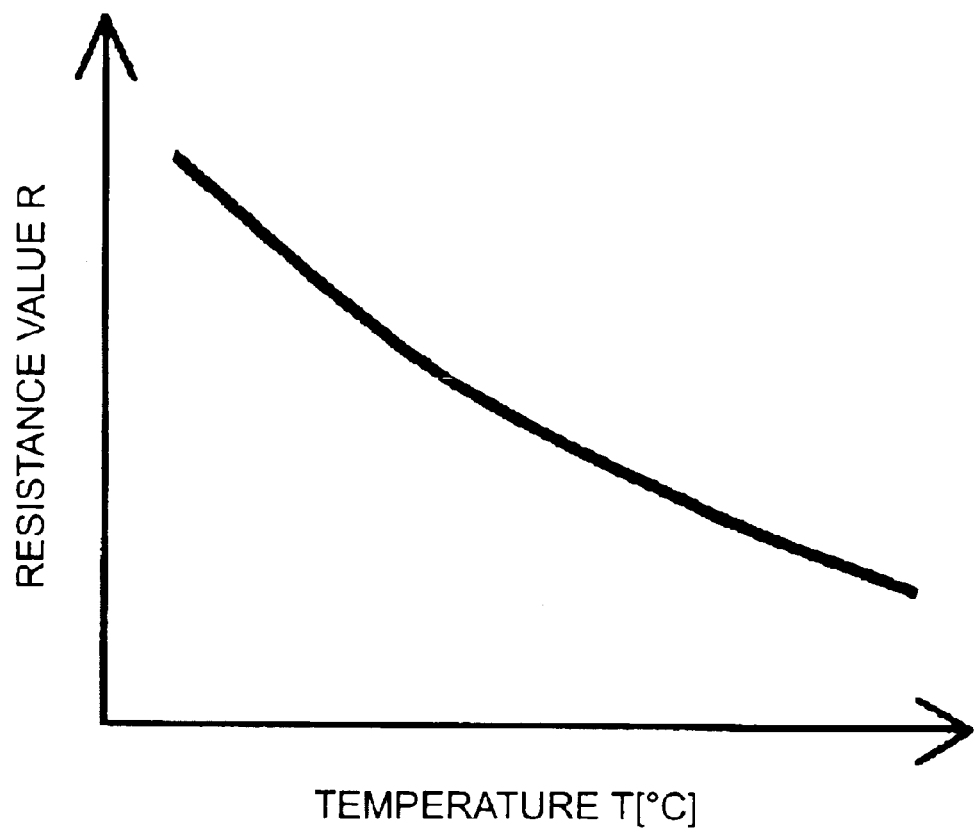
FIG. 10 shows temperature characteristics of a resistance value possessed by an NTC thermistor used in the third embodiment of the present invention.

The NTC thermistor RT has negative temperature characteristics. In general, as shown in FIG. 10, when the ambient temperature increases, the resistance value R of the NTC thermistor RT decreases in a manner of an exponent function.

Figure 11:
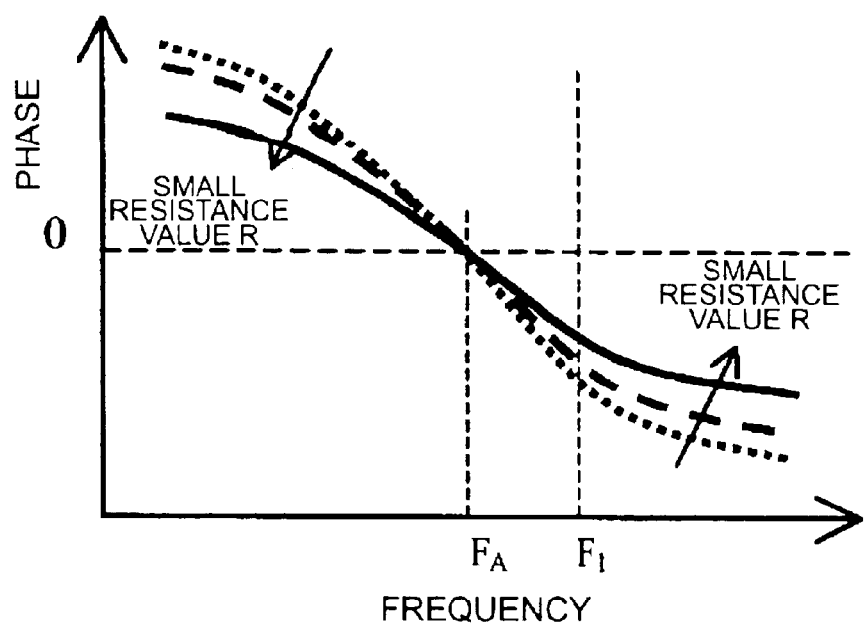
FIG. 11 shows frequency-phase characteristics of an LC parallel resonance circuit when the NTC thermistor is connected in parallel.

FIG. 11 shows frequency-phase characteristics in a case where the resistance value R of the NTC thermistor RT of an LC parallel resonance circuit 5c is varied. As indicated by the arrows of FIG. 11, for the frequency-phase characteristics, characteristics are obtained such that, the smaller the resistance value R of the NTC thermistor. RT, the more counterclockwise the frequency-phase characteristics are rotated about the resonance frequency FA (for example, 622.08 MHz described above) of the LC parallel resonance circuit 5c. That is, the smaller the resistance value R, the more flat the frequency-phase characteristics are obtained, and the amount of phase change decreases with respect to the frequency change.

Figure 12:
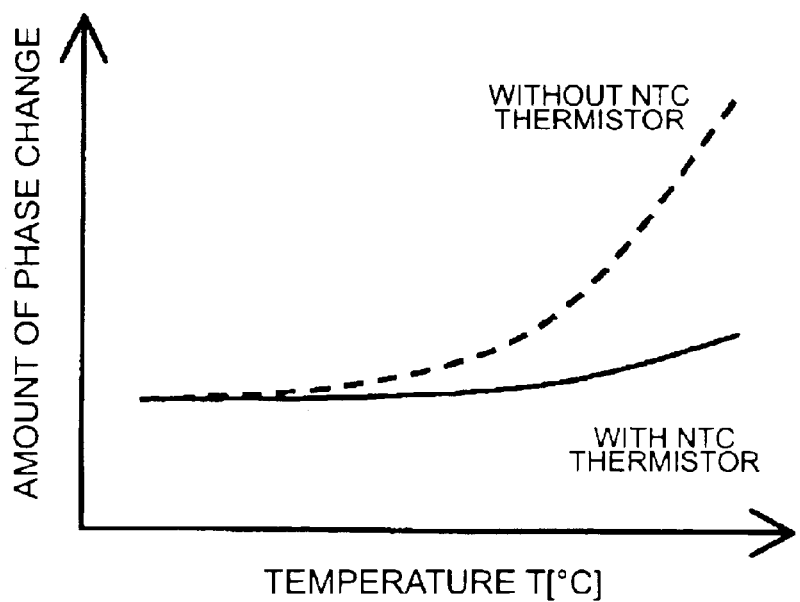
FIG. 12 shows temperature characteristics of the amount of phase change in the LC parallel resonance circuit when the NTC thermistor is connected in parallel and when it is not connected.

FIG. 12 shows temperature-amount of phase change characteristics at a desired frequency F1 (see FIG. 11) higher than the resonance frequency FA of the LC parallel resonance circuit 5c, for example, at a frequency of 625 MHz. The vertical axis of FIG. 12 shows, as the amount of phase change when temperature is changed, the difference from the phase at the frequency F1 by setting the phase at the resonance frequency FA to 0. The broken line shown in FIG. 12 shows characteristics in the case where the thermistor RT is not connected to the LC parallel resonance circuit 5c, and the solid line shows characteristics in the case where the thermistor RT is connected thereto.

As indicated by the broken line of FIG. 12, when the NTC thermistor RT is not connected, whereas the amount of phase change is small in a lower temperature region, the amount of phase change increases in a higher temperature region. On the other hand, as indicated by the solid line of FIG. 12, characteristics are provided such that, when the NTC thermistor RT is connected, the amount of phase change decreases when the resistance value R decreases at a high temperature, and the amount of phase change becomes substantially fixed regardless of low temperature or high temperature. In other words, by decreasing the resistance value R of the NTC thermistor RT in a higher temperature region, the amount of phase change is prevented from becoming larger.

Figure 13:
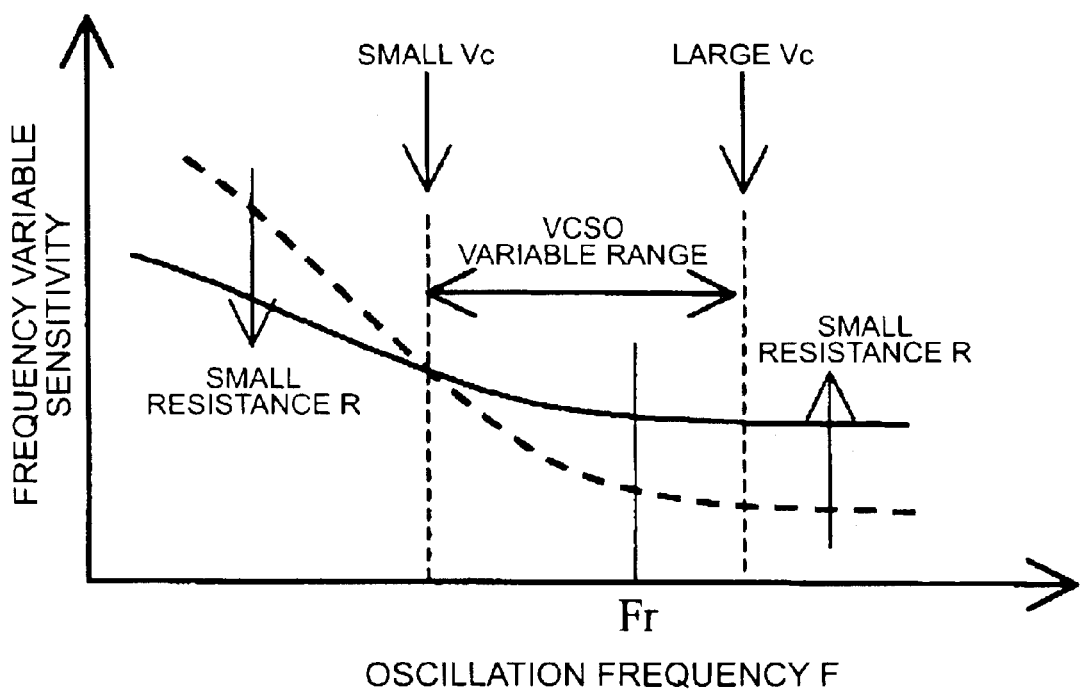
FIG. 13 shows oscillation frequency-frequency variable sensitivity in the positive-feedback oscillation loop of the voltage-controlled SAW oscillator according to the third embodiment of the present invention.

FIG. 13 shows oscillation frequency F-frequency variable sensitivity in the positive-feedback oscillation loop of a voltage-controlled SAW oscillator (VCSO) 1D. Here, the frequency variable sensitivity is represented by the frequency shift of the oscillation frequency per unit control voltage Vc.

In FIG. 13, the broken line shows the frequency variable sensitivity characteristics when the resistance value R of the NTC thermistor RT is larger, and the solid line shows the frequency variable sensitivity characteristics when the resistance value R is smaller. That is, it is shown that the smaller the resistance value R of the NTC thermistor RT as a result of the ambient temperature becoming higher, the more the frequency variable sensitivity is improved also in a region where the oscillation frequency is high and that substantially the same sensitivity as that in a lower region can be offered. Therefore, even if the temperature becomes higher (increases), the resistance value R of the NTC thermistor RT decreases, and the frequency variable sensitivity can be maintained.

Advantages obtained from the third embodiment

Advantages obtained from the third embodiment of the present invention will now be described below.

Figure 14:
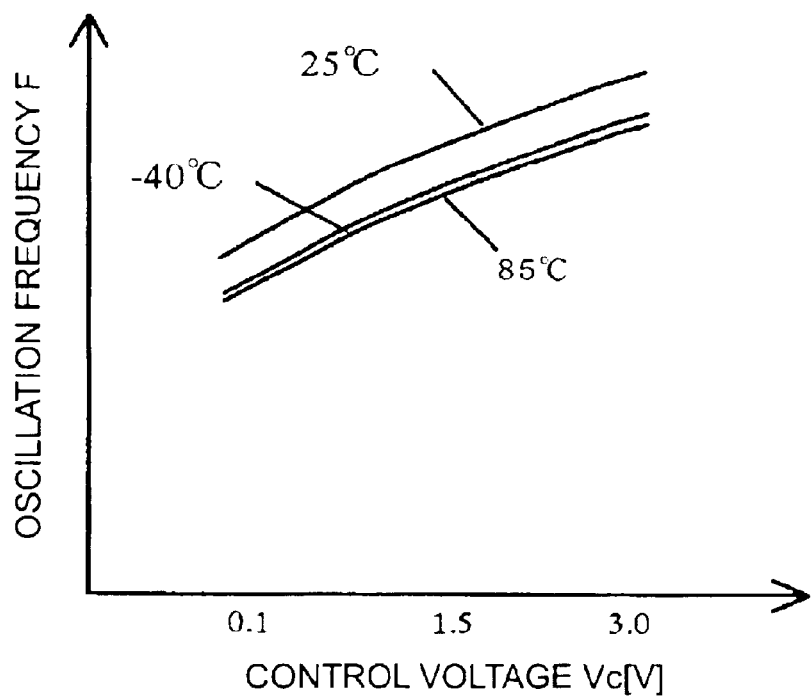
FIG. 14 shows control voltage characteristics of the oscillation frequency of the voltage-controlled SAW oscillator in the third embodiment of the present invention.
Figure 15:
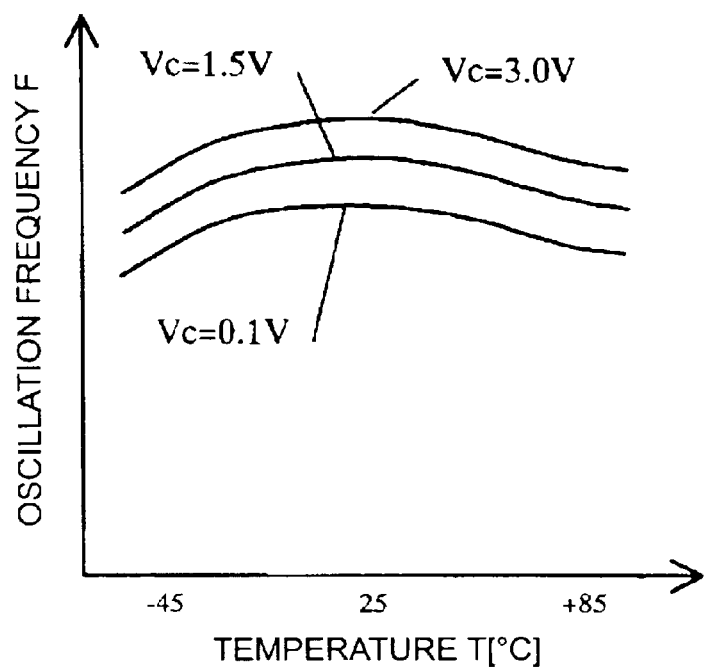
FIG. 15 shows temperature characteristics of the oscillation frequency when the control voltage is varied in the voltage-controlled SAW oscillator in the third embodiment of the present invention.

As described above in FIG. 13, since the frequency variable sensitivity of the positive-feedback oscillation loop can be made substantially fixed regardless of temperature by connecting the NTC thermistor RT in parallel to the LC parallel resonance circuit 5a, improved effects shown in FIGS. 14 and 15 are obtained.

In FIG. 14, as the characteristics of control voltage Vc-oscillation frequency F in the voltage-controlled SAW oscillator (VCSO) show, the change of the oscillation frequency F with respect to the control voltage Vc at a high temperature can be made substantially the same characteristics as those in other temperature regions. Furthermore, as the temperature characteristics of the oscillation frequency F of FIG. 15 show, the change of the oscillation frequency F due to temperature can be made to be characteristics of substantially the same tendency in a wide temperature range. In particular, the temperature characteristics in a high temperature region are greatly improved in comparison with those in a conventional case (see FIG. 22), and changes of the oscillation frequency. F due to temperature can be reduced. Therefore, even if the ambient temperature becomes higher, there is the advantage that a voltage-controlled SAW oscillator (VCSO) in which the frequency is stabilized can be obtained.

When improving the temperature characteristics of the oscillation frequency in a high temperature region, since a simple configuration in which the NTC thermistor RT is connected in parallel to the LC parallel resonance circuit is employed, there is no need to provide a new dedicated temperature compensation circuit. Therefore, the advantages that a larger size of the oscillation circuit is suppressed and miniaturization and lower costs of the voltage-controlled oscillator are achieved are obtained.

Regarding the other advantages, the same advantages as those of the first and second embodiments are obtained.

Fourth Embodiment

A fourth embodiment will now be described below.

Configuration of the fourth embodiment

Figure 16:
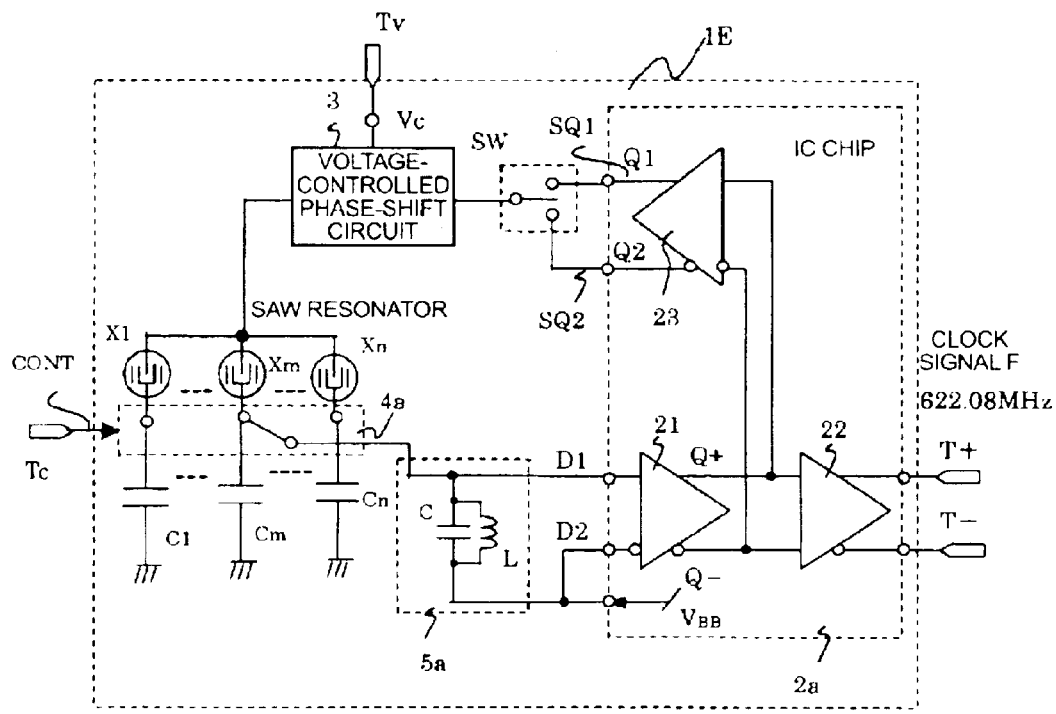
FIG. 16 is a block diagram showing the configuration of a voltage-controlled SAW oscillator in a fourth embodiment of the present invention.

FIG. 16 is a block diagram showing the configuration of a voltage-controlled SAW oscillator (VCSO) 1E according to the fourth embodiment of the present invention. The difference from FIG. 1 which shows the first embodiment is that a switching circuit SW is provided. Since the remaining configuration is the same as that of the first to third embodiments, the same blocks are given the same reference numerals, and accordingly, detailed descriptions thereof are omitted.

As shown in FIG. 16, at a stage subsequent to the feedback-buffer differential amplifier 23, a switching circuit (signal selection section) SW for selecting either a signal SQ1 output from the non-inverting output terminal Q1 thereof or a signal SQ2 output from the inverting output terminal Q2 thereof is provided. Next, at a stage subsequent to the switching circuit SW, the voltage-controlled phase-shift circuit 3 is connected, and the switching circuit SW selectively outputs either the signal SQ1 or the signal SQ2 so that the amount of phase shift in the voltage-controlled phase-shift circuit 3 is decreased. The fourth embodiment is similar to the first to third embodiments in that the LC parallel resonance circuit 5 is formed of a capacitor C, an inductor L, a variable capacitance diode Cvo, and an NTC thermistor RT.

Signal selection by switching circuit

A description will now be given of the selection of the output of the feedback-buffer differential amplifier 23 by means of the switching circuit SW so that the amount of phase shift in the voltage-controlled phase-shift circuit 3 is decreased.

The technical background for providing the switching circuit SW will be described first.

As frequencies used in two optical communication network systems, for example, network systems of 2.5 Gbit/s and 10 Gbit/s, there are a frequency in a 155.52 MHz band in the former and a frequency in a 600 MHz band in the latter. There are cases in which a plurality of SAW resonators which can be used for the two frequencies are provided and a voltage-controlled SAW oscillator (VCSO) which can be used commonly for them is designed. In such a case, if there is a large difference between frequencies used, a plurality of voltage-controlled phase-shift circuit 3 are required, or the scale of one circuit used becomes complex and large. To avoid this problem, means which is simple and which achieves a smaller circuit scale, corresponding to a frequency band to be used, becomes necessary. This means is the switching circuit SW for selecting the output signal of the feedback-buffer differential amplifier 23.

A description will now be given, with reference to FIG. 17, of a procedure for selecting a signal by means of the switching circuit SW in the fourth embodiment.

Figure 17:
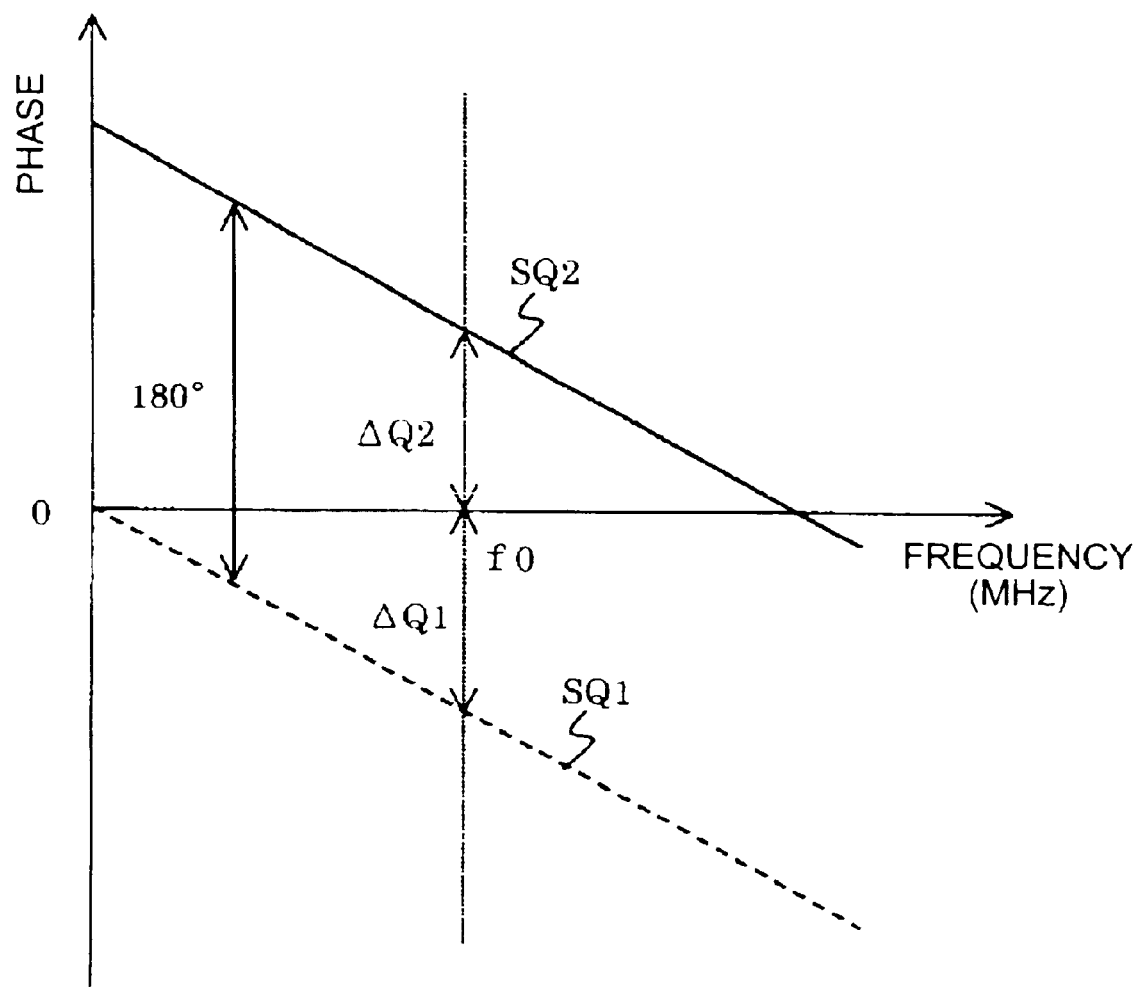
FIG. 17 illustrates the amount of phase shift which is required by a voltage-controlled phase-shift circuit in order to satisfy the phase condition as the entire voltage-controlled SAW oscillator.

FIG. 17 shows the amount of phase shift which is required in the voltage-controlled phase-shift circuit 3 in order to satisfy the phase condition as the entire voltage-controlled SAW oscillator (VCSO) 1E when either the signal SQ1 or the signal SQ2 is used. That is, the desired resonance frequency in the voltage-controlled SAW oscillator (VCSO) 1E is denoted as fm, and it is assumed that the signal SQ1 is used in the positive-feedback oscillation loop. In this case, it is shown that, in order to satisfy the phase condition in the entire positive-feedback oscillation loop, the amount of phase shift in the voltage-controlled phase-shift circuit 3 must be $\Delta Q1$. The same applies to the signal SQ2.

The phase difference $\Delta Q1$ is compared with the phase difference $\Delta Q2$, and the switching circuit SW is switched to the TX terminal (X=1, 2) side where the amount of phase shift in the voltage-controlled phase-shift circuit 3 is smaller.

This switching is usually performed in synchronization with the switching of the SAW resonators X1 to Xn in accordance with the external control signal CONT. The switching may be manual switching using a mechanical switch rather than using an external control signal CONT.

When $\Delta Q1 > \Delta Q2$ (in the case of the higher frequency, for example, the above-mentioned 622.08 MHz), the switching circuit SW is made to be the T2 terminal side of the inverting output terminal Q2 of the feedback-buffer differential amplifier 23. When $\Delta Q1 < \Delta Q2$ (in the case of the lower frequency, for example, the above-mentioned 155.52 MHz), the switching circuit SW is made to be the T1 terminal side of the non-inverting output terminal Q1 of the feedback-buffer differential amplifier 23.

There is a phase condition of the positive-feedback oscillation loop formed of the oscillation differential amplifier circuit 21, the feedback-buffer differential amplifier 23, the switching circuit SW, the voltage-controlled phase-shift circuit 3, the SAW resonator Xm, and the LC parallel resonance circuit 5a. In this case, the sum of the phase difference θG between the input and output signals of the oscillation differential amplifier 21 and the phase shift θβ caused by the feedback-buffer differential amplifier 23, the switching circuit SW, the voltage-controlled phase-shift circuit 3, the SAW resonator Xm, and the LC parallel resonance circuit 5a, and a line connecting the above satisfy the following equation.

$$\theta G + \theta \beta = 2 \cdot n \cdot \pi (n=0, 1, \ldots) \qquad \text{Equation 1}$$

As a result of this phase condition being satisfied, the voltage-controlled SAW oscillator (VCSO) 1E oscillates, and reference signals are output from the non-inverting output terminal Q1 and the inverting output terminal Q2.

As described in the foregoing, as a result of employing a configuration in which one of two signals having mutually different phases, which are output from the feedback-buffer differential amplifier 23, is selected by the switching circuit SW, the adjustable amount of phase shift in the voltage-controlled phase-shift circuit 3 may be small.

Advantages obtained from the fourth embodiment

Advantages similar to those of the above-described first to third embodiments are obtained, and the following advantages are obtained.

According to the fourth embodiment, as a result of employing a configuration in which one of two signals having mutually different phases, which are output from the feedback-buffer differential amplifier, is selected by the switching circuit SW, the adjustable amount of phase shift in the voltage-controlled phase-shift circuit can be set to be small. As a result, the advantages that a plurality of voltage-controlled phase-shift circuits are not necessary, or the complexity of the voltage-controlled phase-shift circuit is suppressed, miniaturization and lower costs of the voltage-controlled oscillator can be achieved without increasing the circuit scale of the oscillation circuit, are obtained.

Fifth Embodiment

A fifth embodiment will now be described below.

Configuration of the fifth embodiment

Figure 18:
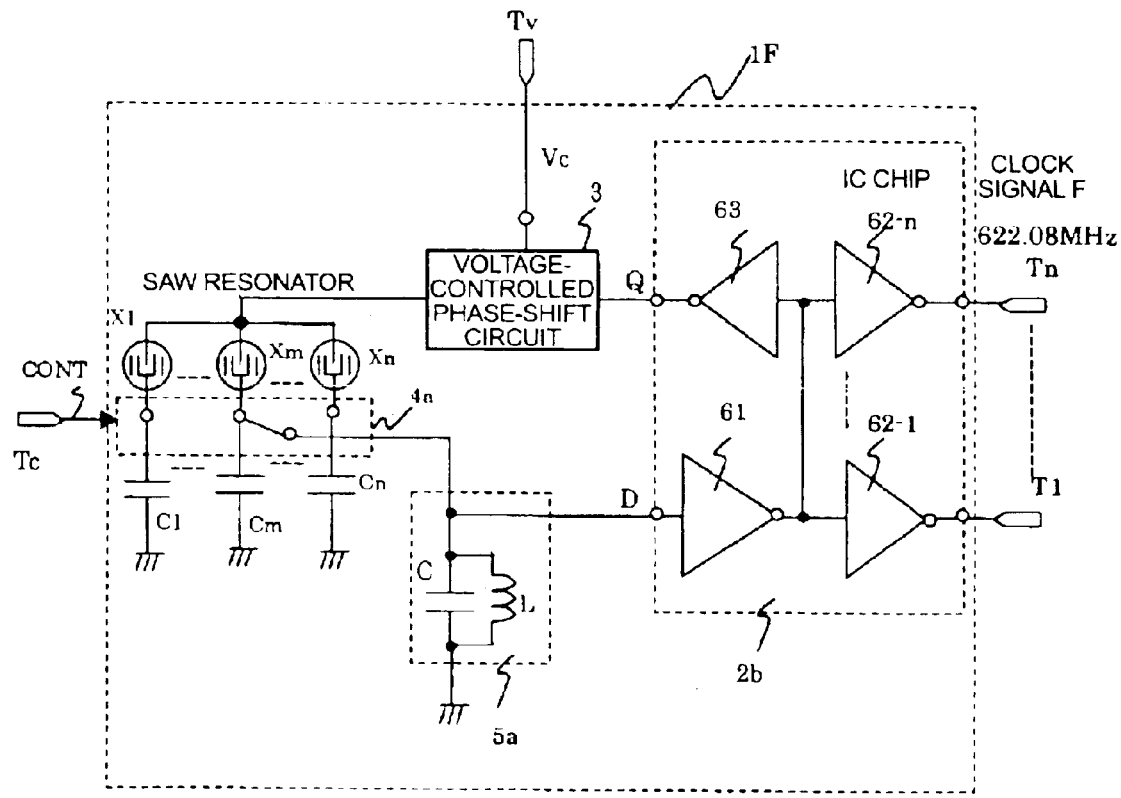
FIG. 18 is a block diagram showing the configuration of a voltage-controlled SAW oscillator in a fifth embodiment of the present invention.

FIG. 18 is a block diagram showing the configuration of a voltage-controlled SAW oscillator (VCSO) 1F according to the fifth embodiment of the present invention.

The difference from FIG. 1 is that an amplifier of single input/output type is used in place of a differential amplifier. That is, the difference is that a plurality of amplifiers 62-1 to 62-n and 63 are connected in parallel to the output of an oscillation amplifier 61, and these are used as a feedback-buffer amplifier 63 which forms a positive-feedback oscillation loop and the amplifiers 62-1 to 62-n for external output. Since the remaining configuration is the same as in one of the first to third embodiments, the same blocks are given the same reference numerals, and accordingly, detailed descriptions thereof are omitted.

Advantages obtained from the fifth embodiment

Advantages similar to those of the above-described first to fourth embodiments are obtained, and the following advantages are obtained.

When a plurality of load circuits are connected to the output of the voltage-controlled oscillator, in order to avoid an influence between load circuits, a driver IC for an output buffer is necessary as an external part of the voltage-controlled oscillator.

In such a case, according to the configuration of the fifth embodiment, mutual influences can be avoided by causing an output signal of the oscillation amplifier to branch via one of a plurality of output amplifiers provided inside an IC chip and by connecting a plurality of load circuits to each of them. At the same time, it is not necessary to additionally provide a part such as a driver IC for an output buffer, which is used externally, and there are advantages that miniaturization and lower costs can be achieved.

Sixth Embodiment

A sixth embodiment will now be described below.

A description is given of a case in which the voltage-controlled SAW oscillator (VCSO) of each of the above-described embodiments according to the present invention is applied to a communication device.

Figure 19:
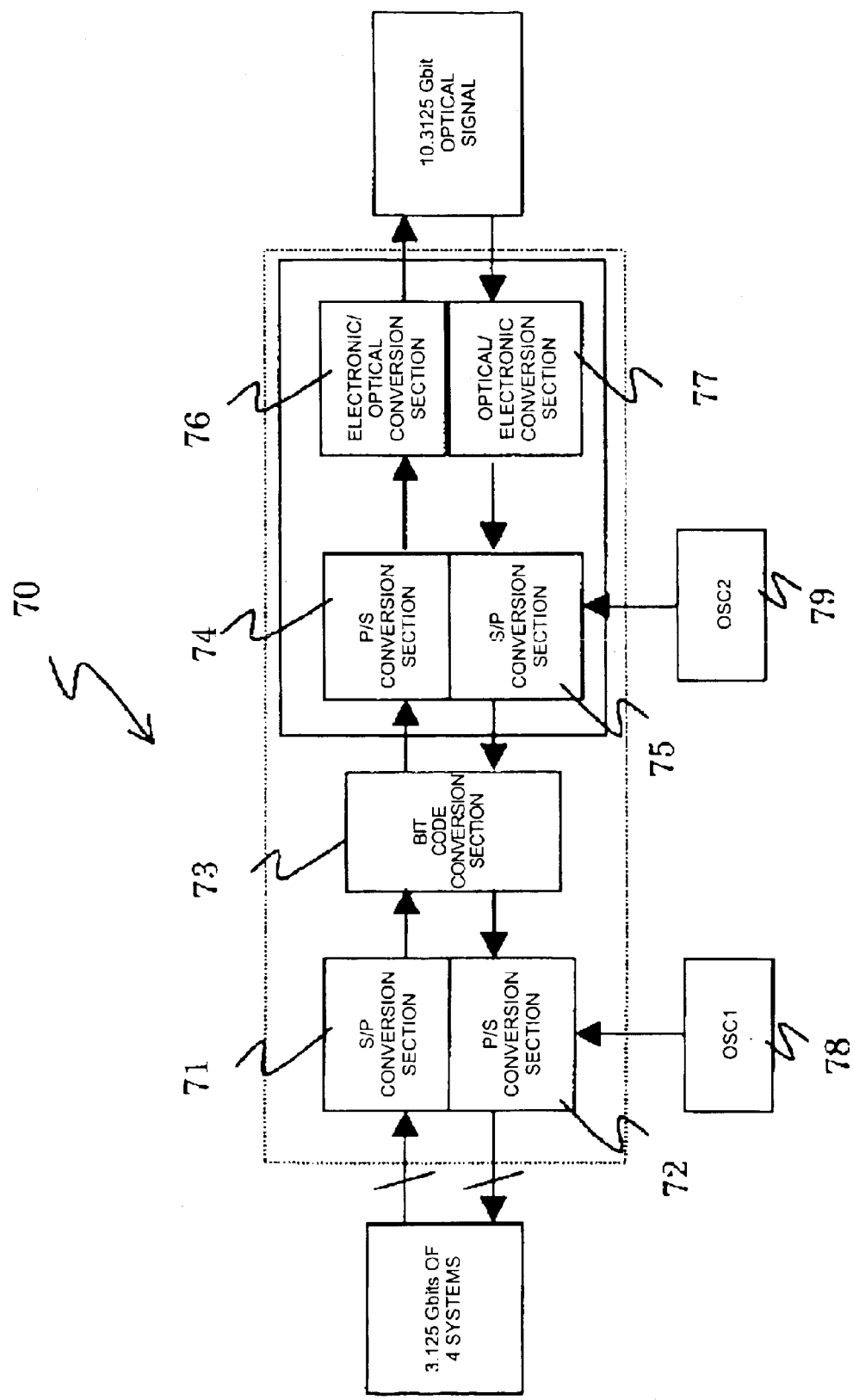
FIG. 19 is a block diagram showing the overview of an optical interface module when the voltage-controlled SAW oscillator is used in a sixth embodiment of the present invention.
Figure 20:
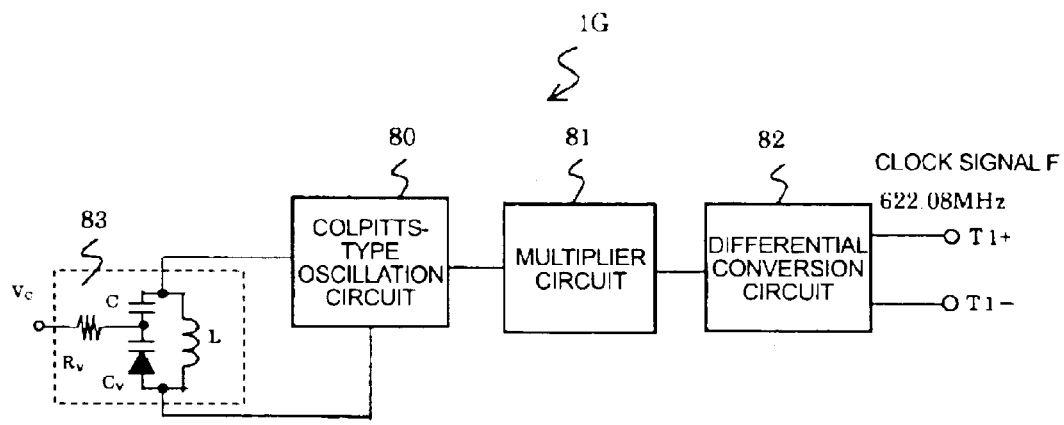
FIG. 20 is a block diagram showing the configuration of a conventional voltage-controlled oscillator which consists of a parallel resonance circuit using an LC.
Figure 21:
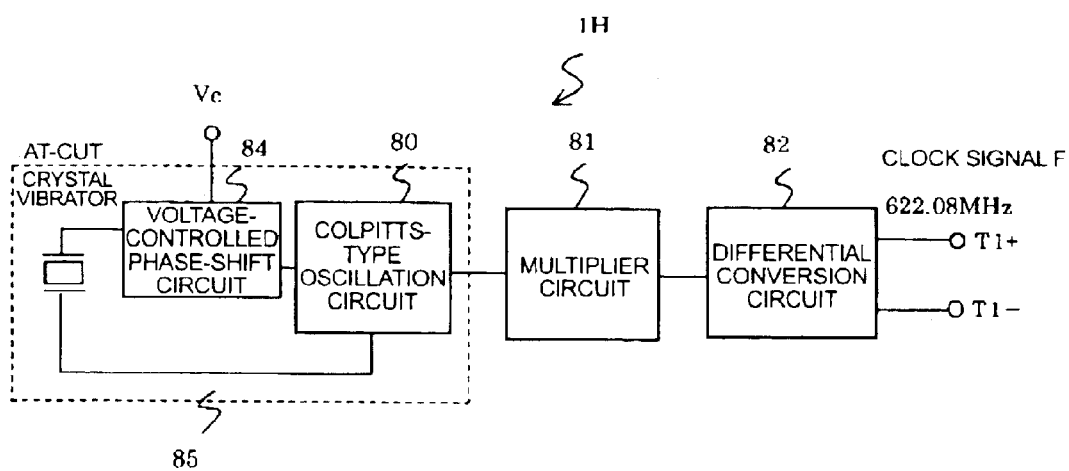
FIG. 21 is a block diagram showing the configuration of a conventional voltage-controlled oscillator using an AT-cut crystal vibrator.

FIG. 19 is a block diagram showing the overview of an optical interface module 70 when the voltage-controlled SAW oscillator (VCSO) 1A according to the present invention is used. The optical interface module 70 performs signal conversion between an optical signal and an electrical signal in order to perform data transmission and reception via an optical network. For example, signal conversion between an optical signal of 10.3125 Gbit/s and an electrical signal of 3.125 Gbit/s (four systems) is performed. An electronic/optical conversion section 76 converts an electrical signal output from a P/S (parallel/serial) conversion section 74 into an optical signal, and outputs it to the optical network side.

An optical/electronic conversion section 77 converts an optical signal input from the optical network side into an electrical signal, and outputs it to an S/P (serial/parallel) conversion section 75.

Voltage-controlled oscillators 78 and 79 are voltage-controlled SAW oscillators (VCSO) 1A according to the present invention, and output a clock signal of a stabilized fixed frequency, in which jitter is considerably reduced. Then, this clock signal, as a reference signal, is used for an S/P conversion section 71 and a P/S conversion section 72 of 3.125 Gbit/s, and a P/S conversion section 74 and an S/P conversion section 75 of 10.3125 Gbit/s, which are connected via a bit code conversion section 73.

As has thus been described, an LC parallel resonance circuit is simply formed for each selected SAW resonator, and a highly stabilized voltage-controlled SAW oscillator (VCSO) in which unwanted jitter is greatly reduced is used. As a result, since a timing margin between transmission and reception data and the clock signal is ensured, it is possible to stably perform data transmission and reception via an optical network without malfunction.

Furthermore, in a high-speed network system of 10 Gbit/s, at which a large amount of data such as a moving image can be transmitted, the advantage that a stable operation can be easily ensured is obtained.

The voltage-controlled SAW oscillator (VCSO) of the present invention incorporates a plurality of SAW resonators, and has a control signal for switching the resonance frequencies thereof, making external control possible. Therefore, if one voltage-controlled SAW oscillator (VCSO) of the present invention is incorporated, the advantage that the oscillation frequencies can be switched in accordance with the system specification from the system side is obtained. At the same time, since there is no need to provide a plurality of individual voltage-controlled SAW oscillators (VCSO) with different frequencies, the advantage is obtained in that an optical interface module in which miniaturization and lower costs are achieved can be provided.

Also, when the voltage-controlled SAW oscillators (VCSO) 1B, 1C, 1D, 1E, and 1F in the second to fourth embodiments of the present invention are applied to the voltage-controlled oscillators 78 and 79, the same advantages as those of the voltage-controlled SAW oscillator (VCSO) 1A are obtained.

Modifications.

The present invention is not limited to the above-described embodiments and can be practiced in various forms. For example, the following modifications are possible.

First Modification

Although the amplifier of the above-described embodiments is described by showing an embodiment in which a bipolar transistor is used, the amplifier may be formed of an MOS transistor having a different type of transistor.

Second Modification

Although a case in which the voltage-controlled oscillator is used in an optical interface module for a network is described, the voltage-controlled oscillator can be applied to various electronic devices such as wireless communication devices such as cellular phones requiring an oscillator, in particular, a high-frequency oscillator.

Third Modification

For piezoelectric materials for forming a piezoelectric vibrator such as a crystal vibrator, a ceramic vibrator, and a SAW resonator, in addition to crystal quartz, Langasite and lithium tetraborate may be used as other piezoelectric materials.

The entire disclosure of Japanese Patent Application No. 2002-329568 filed Nov. 13, 2002 is incorporated by reference.

What is claimed is:

1. A voltage-controlled oscillator comprising:
    a voltage-controlled phase-shift circuit for outputting an output signal in which the phase of an input signal is shifted by a predetermined amount in accordance with an external control voltage;
    a plurality of SAW resonators, each of which resonates at a predetermined resonance frequency;
    first switching means for selecting one of said plurality of SAW resonators in accordance with the external control voltage;
    frequency selection means for selecting an output signal having a predetermined resonance frequency from one SAW resonator among said plurality of SAW resonators, which is selected by said first switching means;
    an oscillation differential amplifier for amplifying and outputting a resonance signal of said predetermined resonance frequency; and
    a feedback-buffer differential amplifier for inputting the output signal from said oscillation differential amplifier,
    wherein said voltage-controlled phase-shift circuit, the SAW resonator selected by said first switching means, said frequency selection means, said oscillation differential amplifier, and said feedback-buffer differential amplifier form a positive-feedback oscillation loop.

2. A voltage-controlled oscillator according to claim 1, wherein said frequency selection means is formed as an LC parallel resonance circuit having an inductance element and a capacitance element,
    there is provided a passive element connected in series between one end of each of said plurality of SAW resonators and a ground, and
    when one of said plurality of SAW resonators is selected, said passive element connected in series to said selected SAW resonator is connected in parallel to said LC parallel resonance circuit.

3. A voltage-controlled oscillator according to claim 1, wherein said frequency selection means is formed as an LC parallel resonance circuit having an inductance element and a capacitance element,
    there are provided:
    second switching means; and
    a passive element connected in series to said second switching means, and
    when one of said plurality of SAW resonators is selected, said passive element selected by said second switching means, corresponding to said selected SAW resonator, is connected in parallel to said LC parallel resonance circuit.

4. A voltage-controlled oscillator according to claim 1, wherein said frequency selection means is formed as an LC parallel resonance circuit having an inductance element and a variable capacitance element,
    there is provided control voltage generation means for generating a control voltage for controlling the capacitance of said variable capacitance element in accordance with an external control signal.

5. A voltage-controlled oscillator according to claim 1, wherein there is provided signal selection means for selecting, as said positive-feedback oscillation loop, one of the output terminals of said feedback-buffer differential amplifier having an inverting output terminal and a non-inverting output terminal.

6. A voltage-controlled oscillator according to claim 1, wherein said differential amplifier is a differential amplifier circuit using an ECL line receiver.

7. A voltage-controlled oscillator according to claim 2, wherein said passive element connected in parallel to said LC parallel resonance circuit is a capacitance element.

8. A voltage-controlled oscillator according to claim 2, wherein said frequency selection means comprises an NTC thermistor having negative temperature characteristics.

9. An electronic device comprising a voltage-controlled oscillator according to claim 1.

10. A voltage-controlled oscillator according to claim 3, wherein said passive element connected in parallel to said LC parallel resonance circuit is a capacitance element.

11. A voltage-controlled oscillator comprising:
    a voltage-controlled phase-shift circuit for outputting an output signal in which the phase of an input signal is shifted by a predetermined amount in accordance with an external control voltage;
    a plurality of SAW resonators, each of which resonates at a predetermined resonance frequency;
    first switching means for selecting one of said plurality of SAW resonators in accordance with the external control voltage;
    frequency selection means for selecting an output signal having a predetermined resonance frequency from one SAW resonator among said plurality of SAW resonators, which is selected by said first switching means;
    an oscillation amplifier for amplifying and outputting the predetermined resonance signal selected by said frequency selection means;
    a feedback-buffer amplifier for inputting the output signal from said oscillation amplifier; and
    a plurality of output amplifiers for inputting a signal from said oscillation amplifier and outputting an output signal,
    wherein said voltage-controlled phase-shift circuit, the SAW resonator selected by said first switching means, said frequency selection means, said oscillation amplifier, and said feedback-buffer amplifier form a positive-feedback oscillation loop.

12. A voltage-controlled oscillator according to claim 11, wherein said frequency selection means is formed as an LC parallel resonance circuit having an inductance element and a capacitance element,
    there is provided a passive element connected in series between one end of each of said plurality of SAW resonators and a ground, and
    when one of said plurality of SAW resonators is selected, said passive element connected in series to said selected SAW resonator is connected in parallel to said LC parallel resonance circuit.

13. A voltage-controlled oscillator according to claim 11, wherein said frequency selection means is formed as an LC parallel resonance circuit having an inductance element and a capacitance element,
    there are provided:
    second switching means; and
    a passive element connected in series to said second switching means, and
    when one of said plurality of SAW resonators is selected, said passive element selected by said second switching means, corresponding to said selected SAW resonator, is connected in parallel to said LC parallel resonance circuit.

14. A voltage-controlled oscillator according to claim 11, wherein said frequency selection means is formed as an LC parallel resonance circuit having an inductance element and a variable capacitance element, there is provided control voltage generation means for generating a control voltage for controlling the capacitance of said variable capacitance element in accordance with an external control signal.

15. A voltage-controlled oscillator according to claim 12, wherein said passive element connected in parallel to said LC parallel resonance circuit is a capacitance element.

16. A voltage-controlled oscillator according to claim 12, wherein said frequency selection means comprises an NTC thermistor having negative temperature characteristics.

* * * * *

UNITED STATES PATENT AND TRADEMARK OFFICE
CERTIFICATE OF CORRECTION

PATENT NO. : 6,933,794 B2  
APPLICATION NO. : 10/712411  
DATED : August 23, 2005  
INVENTOR(S) : Hiroyuki Ogiso It is certified that error appears in the above-identified patent and that said Letters Patent is hereby corrected as shown below:

| | |
|---|---|
| Column 1, Line 27: | "be" should be -- being -- |
| Column 1, Line 30: | "be" should be -- being -- |
| Column 8, Line 37: | "reflector" should be -- reflector, -- |
| Column 10, Line 4: | "forgoing," should be -- foregoing, -- |
| Column 10, Line 37: | "m m')" should be -- (m = m') -- |
| Column 10, LIine 41: | "forgoing," should be -- foregoing, -- |
| Column 15, Line 7: | "frequency. F" should be -- frequency F -- |

Signed and Sealed this

Twenty-second Day of August, 2006

JON W. DUDAS  
*Director of the United States Patent and Trademark Office*